(12) United States Patent
Nithyanandhan et al.

(10) Patent No.: US 11,377,562 B2
(45) Date of Patent: Jul. 5, 2022

(54) SQUARAINE DYES AND APPLICATIONS THEREOF

(71) Applicant: Council of Scientific and Industrial Research, New Delhi (IN)

(72) Inventors: Jayaraj Nithyanandhan, Pune (IN); Ananthan Alagumalai, Pune (IN); Munavvar Fairoos, Pune (IN); Punitharasu Vellimalai, Pune (IN)

(73) Assignee: Council of Scientific & Industrial Research, New Delhi (IN)

( * ) Notice: Subject to any disclaimer, the term of this patent is extended or adjusted under 35 U.S.C. 154(b) by 282 days.

(21) Appl. No.: 16/320,177

(22) PCT Filed: Jul. 28, 2017

(86) PCT No.: PCT/IN2017/050313
§ 371 (c)(1),
(2) Date: Jan. 24, 2019

(87) PCT Pub. No.: WO2018/020518
PCT Pub. Date: Feb. 1, 2018

(65) Prior Publication Data
US 2019/0270889 A1    Sep. 5, 2019

(30) Foreign Application Priority Data
Jul. 28, 2016    (IN) .............................. 201611025821

(51) Int. Cl.
*C09B 57/00*    (2006.01)
*C09B 23/00*    (2006.01)
(Continued)

(52) U.S. Cl.
CPC ........ *C09B 57/007* (2013.01); *C09B 23/0066* (2013.01); *H01G 9/2013* (2013.01);
(Continued)

(58) Field of Classification Search
CPC .................... C09B 57/007; C09B 23/0066; H01G 9/2013; H01G 9/2031; H01G 9/2059;
(Continued)

(56) References Cited

U.S. PATENT DOCUMENTS

2010/0300521 A1    12/2010  Fuhrmann et al.

FOREIGN PATENT DOCUMENTS

EP    0973181 A1 *  1/2000  .......... C09B 57/007
JP    2001036110 A *  2/2001
(Continued)

OTHER PUBLICATIONS

Qin et al., Chem. Asian J. 2013, 8 1706-1719. Squaraine Dyes of Dye-Sensitized solar cells: Recent Advances and Futrue Challenges.*
(Continued)

*Primary Examiner* — Ling Siu Choi
*Assistant Examiner* — Ronald Grinsted
(74) *Attorney, Agent, or Firm* — Fish & Richardson P.C.

(57) ABSTRACT

The present invention disclosed a squaraine dye of formula (I) and process for the preparation thereof. Further, the present invention disclosed to an electronic device comprising dye of formula (I).

20 Claims, 5 Drawing Sheets

(51) Int. Cl.
  *H01G 9/20* (2006.01)
  *H01L 51/00* (2006.01)
  *C09B 23/01* (2006.01)

(52) U.S. Cl.
  CPC ......... *H01G 9/2031* (2013.01); *H01G 9/2059* (2013.01); *H01G 9/2063* (2013.01); *H01L 51/0064* (2013.01); *H01L 2251/305* (2013.01); *H01L 2251/306* (2013.01); *Y02E 10/542* (2013.01); *Y02E 10/549* (2013.01)

(58) Field of Classification Search
  CPC .............. H01G 9/2063; H01L 51/0064; H01L 2251/305; H01L 2251/306; Y02E 10/542; Y02E 10/549
  USPC .......................................................... 549/43
  See application file for complete search history.

(56) References Cited

FOREIGN PATENT DOCUMENTS

| JP | 2011-165963 | | 8/2011 |
|---|---|---|---|
| JP | 2011165963 | * | 8/2011 |
| WO | 2009/053107 | | 4/2009 |

OTHER PUBLICATIONS

Magistris et al., "Near-infrared absorbing squaraine dye with extended pi conjugation for dye-sensitized solar cells", Renewable Energy, vol. 60, (2013), pp. 672-678. (Year: 2013).*
Alagumalai et al: 'Effect of Out-of-Plane Alkyl Group's Position in Dye-Sensitized Solar Cell Efficiency: A Structure-Property Relationship Utilizing Indoline-Based Unsymmetrical Squaraine Dyes', ACS Applied Materials & Interfaces, 8(51): 35353-35367, Dec. 28, 2016.
Qin et al: 'Squaraine Dyes for Dye-Sensitized Solar Cells: Recent Advances and Future Challenges', AAChemistry—An Asian Journal, 8(8): 1706-1719, Apr. 17, 2013.
European Patent Office, International Search Report for PCT/IN2017/050313 dated Oct. 24, 2017.
Morimoto et al., "Design of Far-Red Sensitizing Squaraine Dyes Aiming Towards the Fine Tuning of Dye Molecular Structure", Journal of Nanoscience and Nanotechnology, American Sci Ent! Fic Publishers, US, 16(4): 3282-3288, Apr. 2016.
Bisht et al: 'Panchromatic Sensitizer for Dye-Sensitized Solar Cells: Unsymmetrical Squaraine Dyes Incorporating Benzodithiophene [pi]-Spacer with Alkyl Chains to Extend Conjugation, Control the Dye Assembly on TiO 2 , and Retard Charge Recombination', The Journal of Organic Chemistry, 82(4): 1920-1930, Feb. 8, 2017.
Written Opinion for International Application No. PCT/IN2017/050313 dated Oct. 24, 2017.

* cited by examiner

SQUARAINE DYES AND APPLICATIONS THEREOF

FIELD OF THE INVENTION

The present invention relates to a novel squaraine dyes. More particularly, the present invention relates to a squaraine dye of formula (I) and process for the preparation thereof. Further, the present invention relates to an electronic device comprising squaraine dye of formula (I).

BACKGROUND AND PRIOR ART

Dye sensitized solar cells evolved as a potential photovoltaic device since 1991 due to their high power conversion efficiency and ease of fabrication. Metal free sensitizers are attractive as the molar absorptivities are often higher than the ruthenium based sensitizers. Majority of the D-π-A dyes were efficient sensitizers in the visible light region. Porphyrin dyes have been designed to achieve the efficiency about 13%. There were very limited chromophores that absorb in the NIR regions such as phthalocyanines, porphyrines, and polymethine dyes. Squaraine dyes falls in to the family of polymethine dyes, and since the discovery, it has been used in various applications because of its intense absorption and emission properties in the NIR region with narrow absorption, higher extinction coefficient and photostability.

Apart from their optical properties, these classes of dyes undergo aggregation due to the alignment of intrinsic molecular dipole. Such aggregated structure may have either blue shifted (H-Aggregate) or red-shifted absorption (J-aggregate) with respect to the monomer absorption band. Aggregation induced effects have been studied and rationally applied in terms of molecular probes, optical imaging and organic field effect transistor by several groups. Aggregation of dyes on the semi-conducting metal oxide surface leads to varied DSSC device efficiency. However, aggregation of squaraine (SQ) dyes on $TiO_2$ surface hampers the device efficiency and considering the aggregation-induced-self-quenching in dye sensitized solar cell (DSSC), the design and synthesis of squaraine dyes to avoid aggregation that assists to improve the power conversion efficiency is an interesting subject.

Squaraine dyes belong to NIR active dyes, and utilized as sensitizer and donor material in DSSC and OPV, respectively. The relatively easy method of synthesis and tuneable absorption properties makes them unique in compared to the conventional D-pi-A dyes. Having pi-spacer between (a) SQ moiety and anchoring group, and (b) donor and SQ unit, modifying one of the donor units, and cis-configured-dicyano or -cyanoester derivatives are the strategies to have a panchromatic absorption due to the induction of high energy visible absorption bands and modulations of Frontier molecular orbital positions. Sqauraine dyes functionalized with thiophene (YR6), dihexyl-CPDT (JD10) and branched alkyl group substituted silolo-dithiophene showed impressive device efficiency of 6.74%, 7.3% and 8.9% respectively.

US patent application no. 20100300521 disclosed squarylium dyes including an anchoring group, to a method of synthesis of such dye, to an electronic device comprising such dye, and to uses of such dye.

Seminal paper from Grätzel group (*J. Am. Chem. Soc.* 2007, 129, 10320-10321) on the unsymmetrical SQ dye paves the foundation of designing high efficient SQ dyes. Extending the conjugation with thiophene and dithienothiophene (DTT) and units increases both Voc and Jsc and overall efficiency of 6.74% and 6.00% respectively. Generally, alkyl groups have been introduced to reduce the level of aggregation besides increasing the short circuit current (Isc) and open circuit potential (Voc). There are two ways by which the alkyl groups can be introduced to the dye structure: (i) in-plane and (ii) out-of-plane modes. Design of non-aggregating dyes that contains out-of-plane alkyl groups requires methylene groups in the planar conjugated π-bridge.

The high efficiency dyes possessing π-bridge based on alkyl group substituted fluorene and cyclopentadithiophene (CPDT) have been reported in *Chem. Eur. J.*, 2013, 19, pp 1819-1827. Delcamp et al. reported (*Chem. Mater.* 2015, 27, 2480-2487) extending the conjugation of SQ with CPDT and silyl-derivative of CPDT (silalo dithiophene) unit with out-of-plane alkyl groups increases both voc and jsc for the observed efficiency of 7.3% and 8.9% respectively which is highest efficiency with the SQ based dyes. Such an approach of introducing alkyl/aryl groups to avoid the aggregation was cleverly explored in improving the device efficiency of phthalocyanine based dyes and porphyrine based dyes.

U.S. Pat. No. 8,637,680 discloses a squarylium dye having a carboxyindolenine structure and an N-alkyl substituent, and a photoelectric conversion element having high photoelectric conversion efficiency in a near-infrared region and a dye-sensitized solar cell, both of which are produced using the squarylium dye. The dye-sensitized solar cell, comprising a squarylium dye.

Article titled "Asymmetric Squaraine Dyes: Spectroscopic and Theoretical Investigation" by K M Shafeekh et al. published in *J. Phys. Chem. B*, 2013, 117 (28), pp 8536-8546 reports two asymmetric squaraine dyes and their parent symmetric analogues synthesized and fully characterized spectroscopically, offering a safe base for definition of quantitative essential-state models for this interesting class of molecules.

Article titled "Relating the Photodynamics of Squaraine-Based Dye-Sensitized Solar Cells to the Molecular Structure of the Sensitizers and to the Presence of Additives" by G de Miguel et al. published in *J. Phys. Chem. C*, 2012, 116 (42), pp 22157-22168 reports Dye-sensitized solar cells (DSSCs) fabricated with $TiO_2$ nanoparticle thin films and sensitized with four types of indole-based squaraines, SQs (symmetric or asymmetric and varying the length and nature of the alkyl side chain substituents).

A review article titled "Squaraine Dyes for Dye-Sensitized Solar Cells: Recent Advances and Future Challenges" by C Qin published in *Chem Asian J.;* 2013 August; 8(8); pp 1706-19 provides a summary of the developments on squaraine dyes in the field of dye-sensitized solar cells and the opportunities used to improve their overall energy conversion efficiency. In particular, the main factors responsible for the low values of open-circuit voltage, short-circuit photocurrent and fill factor are discussed in detail.

Article titled "Synthesis of squaraine dyes under mild conditions: applications for labelling and sensing of biomolecules" by M H Sleiman published in *Chem. Commun.*, 2014, 50, 5288-5290 reports the synthesis of squaraine dyes under mild conditions by carbodiimide activation of squaric acid or semi-squaraine dyes.

Article titled "Conformational effect of symmetrical squaraine dyes on the performance of dye-sensitized solar cells" by T Maeda et al. published in *J. Mater. Chem. A*, 2013, 1, 1303 reports a symmetrical squaraine dye altered to possess dicyanovinylene functionality on a carbonyl group of the cyclobutene core (SQM1a) synthesized to elucidate the effects of the conformationally locked-in cis-like form ensured by the steric repulsion of dicyanovinylenes on the performance of dye-sensitized solar cells (DSSCs) through a comparison with an unsymmetrical analogue bearing one carboxy group (SQM1b) and a standard squaraine dye (MSQ).

Article titled "A step toward efficient panchromatic multichromophoric sensitizers for dye sensitized solar cells" by F M Jradi et al. published in *Chem. Mater.*, 2015, 27 (18), pp 6305-6313 reports a porphyrin with a Soret band absorbing at high energy is combined with a squaraine absorbing at low energy via an acetylene linker to form a bichromophoric sensitizer with molar extinctions on the order of $10^5$ $M^{-1}$ $cm^{-1}$ and an incident photon-to-current efficiency (IPCE) onset of ~850 nm. Various bulky substituents were installed on both the porphyrin and squaraine moieties, and conjugation was increased with π-bridge spacers to achieve a PCE of 7.6%, which is up to 15% higher than a comparable squaraine-only dye.

Article titled "Electron Transfer of Squaraine-Derived Dyes Adsorbed on $TiO_2$ Clusters in Dye-Sensitized Solar Cells: A Density Functional Theory Investigation" by H H G Tsai et al. published in *J. Phys. Chem. C*, 2015, 119 (9), pp 4431-4443 reports density functional theory (DFT) and time-dependent DFT to investigate the structural, optical, and electron transfer properties of seven recently reported SQ-derived dyes adsorbed on a $(TiO_2)_{38}$ cluster having an anatase (101) surface, as a model for corresponding DSCs.

Article titled "A High-Efficiency Panchromatic Squaraine Sensitizer for Dye-Sensitized Solar Cells" by Y Shi et al. published in *Angew Chem Int Ed Engl.;* 2011; 50(29); pp 6619-21 reports a squaraine sensitizer shows an outstanding power conversion efficiency of 6.74% in liquid dye-sensitized solar cells and 2.69% in solid-state dye-sensitized solar cells.

Several structural changes were attempted to increase the efficiency of a photovoltaic cell, which were centered on avoiding the aggregation of dyes and extending the conjugation for panchromatic light absorption. Introduction of in-plane and out-of-plane alkyl groups helps in increasing the device efficiencies by avoiding the dye aggregation, reducing the charge recombination and proper packing of dyes in $TiO_2$ surface. Substitution of alkyl groups in N-atom/$sp^3$-C atoms of indoline that was away from anchoring group yields better device efficiencies than the corresponding isomeric dyes possess alkyl groups in anchoring group containing indoline moiety.

Therefore, there is need for a SQ dye having substitution of alkyl groups in N-atom/$sp^3$-C atoms of indoline away from anchoring group to yield better device efficiencies than the corresponding isomeric dyes possess alkyl groups in anchoring group containing indoline moiety. Accordingly, squaraine dyes conjugated with benzodithiophene moiety containing cyanoacrylic acid is designed. Further, to control the self assembly of dyes on $TiO_2$, branched alkyl-groups were introduced in indoline and benzodithiphene units.

OBJECTIVE OF THE INVENTION

The main objective of the present invention is to provide a novel squaraine dye of formula (I).

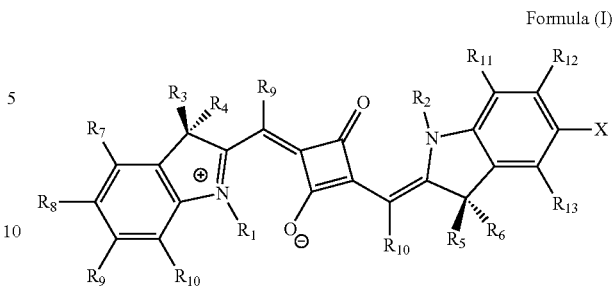

Formula (I)

Another objective of the present invention is to provide a process for preparation squaraine dye of formula (I).

Yet another objective of the present invention is to provide an electronic device comprising squaraine dye of formula (I).

SUMMARY OF THE INVENTION

Accordingly, the present invention provides a novel squaraine dye of formula (I);

Formula (I)

Wherein, $R_1$ and $R_2$ are same or different are selected from straight or branched chain —$C_1$ to $C_{20}$ alkyl, —$C_1$ to $C_{20}$ alkoxy, aryl, arylalkyl, fused aryl polyethylene glycol units (triethyleneglycol monomethylether, tetraethylene glycol monomethylether), $C_1$ to $C_{10}$ perfluoroalkyl chains, halides, cyano, trifluoromethyl;

$R_3$-$R_{13}$ are same or different are selected from hydrogen, straight or branched chain —$C_2$ to $C_{20}$ alkyl, —$C_1$ to $C_{20}$ alkoxy, aryl, arylalkyl, fused aryl polyethylene glycol units (triethyleneglycol monomethylether, tetraethylene glycol monomethylether), $C_1$ to $C_{10}$ perfluoroalkyl chains, halides, cyano, trifluoromethyl;

X is selected from —COOH and $R_{14}$ and $R_{15}$ are same or different and are selected from straight or branched chain —$C_1$ to $C_{20}$ alkyl, —$C_1$ to $C_{20}$ alkoxy;

provided when $R_1$, $R_3$ and $R_4$ are methyl, then $R_2$ is $C_6$ alkyl;

when $R_2$ is $C_6$ alkyl, then $R_1$ is methyl or $C_6$ alkyl.

In preferred embodiment, said squaraine dye of formula (I) is selected from 5-Carboxy-2-[[3-[(1,3-dihydro-1,3,3-trimethyl-2H-indol-2-ylidene)methyl]-2-hydroxy-4-oxo-2-cyclobuten-1-ylidene]methyl]-1,3,3-trimethyl-3H-indolium (SQ1), 5-Carboxy-2-[[3-[(1,3-dihydro-3,3-dimethyl-1-hexyl-2H-indol-2-ylidene)methyl]-2-hydroxy-4-oxo-2-cyclobuten-1-ylidene]methyl]-1,3,3-trimethyl-3H-indolium (SQ2), 5-Carboxy-2-[[3-[(1,3-dihydro-1,3,3-trimethyl-2H-indol-2-ylidene)methyl]-2-hydroxy-4-oxo-2-cyclobuten-1-ylidene]methyl]-3,3-dimethyl-1-hexyl-3H-indolium (SQ3), 5-Carboxy-2-[[3-[(1,3-dihydro-3,3-dimethyl-1-hexyl-2H-indol-2-ylidene)methyl]-2-hydroxy-4-oxo-2-cyclobuten-1-ylidene]methyl]-3,3-dimethyl-1-hexyl-3H-indolium (SQ4), 5-Carboxy-2-[[3-[(1,3-dihydro-1-hexyl-3-decyl-3-octyl-2H-indol-2-ylidene)methyl]-2-hydroxy-4-oxo-2-cyclobuten-1-ylidene]methyl]-1,3,3-trimethyl-3H-indolium (SQ5), 5-Carboxy-2-[[3-[(1,3-dihydro-1,3,3-trimethyl-2H-indol-2-ylidene)methyl]-2-hydroxy-4-oxo-2-cyclobuten-1-ylidene]methyl]-1-hexyl-3-decyl-3-octyl-3H-indolium (SQ6), 5-Carboxy-2-[[3-[(1,3-dihydro-1-hexyl-3-decyl-3-octyl-2H-indol-2-ylidene)methyl]-2-hydroxy-4-oxo-2-cyclobuten-1-ylidene]methyl]-1-hexyl-3-decyl-3-octyl-3H-indolium (SQ7), 4-((5-(6-(2-Carboxy-2-cyanovinyl)-4,8-dimethoxybenzo[1,2-b:4,5-b']dithiophen-2-yl)-1-hexyl-3,3-dimethyl-3H-indol-1-ium-2-yl)methylene)-2-((1-hexyl-3,3-dimethylindolin-2-ylidene)methyl)-3-oxocyclobut-1-en-1-olate (RSQ-1) or 5-[2-Cyano-3-(4,8-bis(2-ethylhexyloxy)benzo[1,2-b:4,5-b]dithiophen-2-yl)acrylic acid]-2-[[3-[(1,3-dihydro-3,3-dimethyl-1-hexyl-2H-indol-2-ylidene)methyl]-2-hydroxy-4-oxo-2-cyclobuten-1-ylidene]methyl]-3,3-dimethyl-1-hexyl-3H-indolium 20d (RSQ2).

In another embodiment, the present invention provides a process for the preparation of squaraine dye of formula (I), wherein said process comprising the steps of:

a) refluxing the reaction mixture of hydrazine compound and 3-alkyl-2-alkanone dissolved in acetic acid at a temperature in the range of 80 to 100° C. for the period in the range of 14 to 16 h to afford corresponding 2-methyl-3,3-dialkyl-3H-indole derivative;

b) refluxing the reaction mixture of alkyl halide and compound of step (a) dissolved in acetonitrile at a temperature in the range of 100 to 110° C. for the period in the range of 14 to 16 h to afford corresponding indolenium salt;

c) heating the reaction mixture of compound of step (b) and 3, 4-dibutoxycyclobut-3-ene-1,2-dione dissolved in solvent in presence of triethylamine at a temperature in the range of 60 to 70° C. for the period in the range of 1 to 2 h to afford semisquaraine compound;

d) refluxing the reaction mixture of compound of step (c) with compound of step (b) dissolved in solvent in presence of pyridine at a temperature in the range of 110 to 115° C. for the period in the range of 20 to 24 h to afford corresponding dye of formula (I), wherein X is —COOH.

In yet another embodiment, said process further comprising the step of:

e) stirring the reaction mixture of squaraine dye of formula (I) of step (d), benzodithiophene derivative (ixa or ixb), palladium (II) acetate [Pd(OAc)$_2$], tricyclohexylphosphine (PCy$_3$), pivalic acid (PivOH) in presence of potassium carbonate (K$_2$CO$_3$) in toluene at a temperature in the range of 110 to 110° C. for the period in the range of 14 to 16 h to afford aldehyde derivative of SQ-BDT (xa to xb);

f) adding cyanoacetic acid and piperidine to the reaction mixture of compound of step (e) in solvent followed by stirring the reaction mixture at a temperature in the range of 70 to 80° C. for the period in the range of 14 to 16 h to afford dye of formula (I) wherein X is not —COOH.

In one embodiment, said reaction optionally comprises refluxing the semi-squariane compound of step (c) in acetone in presence Hydrochloric acid at temperature in the range of 60 to 80° C. for the period in the range of 6 to 8 h to afford semisqauraic acid.

In preferred embodiment, said hydrazine compound is selected from 4-hydrazinobenzoic acid or phenyl hydrazine hydrochloride.

In another preferred embodiment, said 3-alkyl-2-alkanone is selected from 3-octyltridecan-2-one or 3-methylbut-2-one.

In yet another preferred embodiment, said alkyl halide is alkyl iodide selected from 1-iodohexane or iodomethane.

In still another preferred embodiment, said compound indolenium salt is selected from 1-alkyl-2-methyl-3,3-dialkyl-3H-indol-1-ium iodide and 5-carboxy-1-alkyl-2-methyl-3,3-dialkyl-3H-indol-1-ium iodide such as 1,2,3,3-tetramethyl-3H-indolium iodide (5a); 1-hexyl-2,3,3-tetramethyl-3H-indolium iodide (5b); 5-Carboxy-1,2,3,3-tetramethyl-3H-indolium iodide (6a); 5-Carboxy-1-hexyl-2,3,3-trimethyl-3H-indolium iodide (6b); 1-hexyl-2-methyl-3-decyl-3-octyl-3H-indolium iodide (7a) or 5-carboxy-1-hexyl-2-methyl-3-decyl-3-octyl-3H-indolium iodide (7b).

In yet still another preferred embodiment, said semisquaraine compound is selected from (E)-2-((2-butoxy-3,4-dioxocyclobut-1-en-1-yl)methylene)-1,3,3-trimethyl-indoline (8), (E)-2-((2-butoxy-3,4-dioxocyclobut-1-en-1-yl)methylene)-1-hexyl-3,3-dimethyl-indoline (9), (E)-2-((2-butoxy-3,4-dioxocyclobut-1-en-1-yl)methylene)-1,3,3-trimethyl-indoline-5-carboxylic acid (10), (E)-2-((2-butoxy-3,4-dioxocyclobut-1-en-1-yl)methylene)-1-hexyl-3-decyl-3-octyl-indoline-5-carboxylic acid (11).

In yet still another preferred embodiment, said 2-methyl-3,3-dialkyl-3H-indole derivative is selected from 2-methyl-3,3-dialkyl-3H-indole such as 2,3,3-trimethyl-3H-indole (3a), 2,3,3-trimethyl-3H-indole-5-carboxylic acid (4a) or 2-methyl-3,3-dialkyl-3H-indole-5-carboxylic acid such as 2-methyl-3-decyl-3-octyl-3H-indole (3b) or 2-methyl-3-decyl-3-octyl-3H-indole-5-carboxylic acid (4b).

In yet still another preferred embodiment, said process is carried out under nitrogen atmosphere.

In yet still another preferred embodiment, said solvent in step (c), (d) and (f) is selected from 1-butanol, toluene, chloroform, acetonitrile or mixture thereof.

In still another embodiment, the present invention provides an electronic device comprising a squaraine dye of formula (I).

In preferred embodiment, said device is a solar cell.

In another preferred embodiment, said solar cell is a dye-sensitized solar cell, and said dye is chemisorbed to a photoactive semiconductor porous material in said dye-sensitized solar cell.

In yet preferred embodiment, said dye is present in solution or wherein said dye is present in a film.

In yet another preferred embodiment, the solar cell efficiency of above solar cell device is in the range of 2.5 to 9.5%.

In one embodiment, said device further comprises at least one other dye.

DETAILED DESCRIPTION OF THE INVENTION

Figure 1:
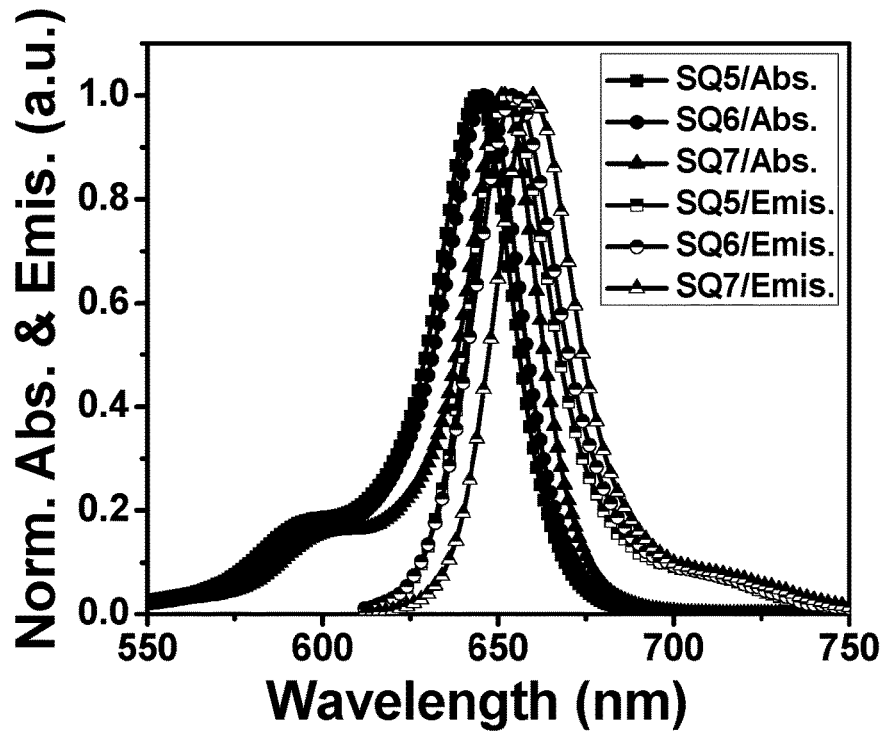
FIG. 1: Normalized UV-Visible absorption and fluorescence spectra of SQ1-SQ7 in $CH_2Cl_2$.

The present invention provides a novel squariane dye of formula (I) and process for the preparation of the same. Further, the present invention provides an electronic device comprising a squaraine dye of formula (I).

Formula (I)

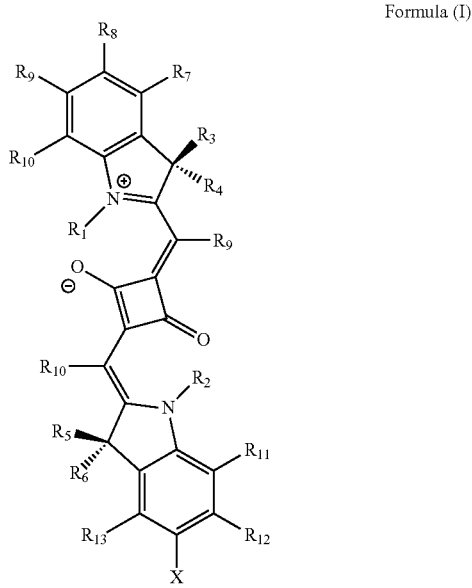

Wherein, $R_1$ and $R_2$ are same or different are selected from straight or branched chain —$C_1$ to $C_{20}$ alkyl, —$C_1$ to $C_{20}$ alkoxy, aryl, arylalkyl, fused aryl polyethylene glycol units (triethyleneglycol monomethylether, tetraethylene glycol monomethylether), $C_1$ to $C_{10}$ perfluoroalkyl chains, halides, cyano, trifluoromethyl;

$R_3$-$R_{13}$ are same or different and are selected from hydrogen, straight or branched chain —$C_2$ to $C_{20}$ alkyl, —$C_1$ to $C_{20}$ alkoxy, aryl, arylalkyl, fused aryl polyethylene glycol units (triethyleneglycol monomethylether, tetraethylene glycol monomethylether), $C_1$ to $C_{10}$ perfluoroalkyl chains, halides, cyano, trifluoromethyl;

X is selected from —COOH,

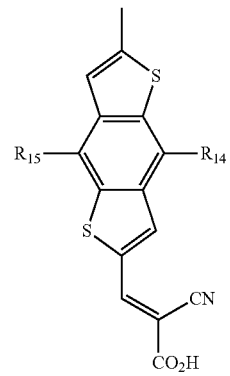

$R_{14}$ and $R_{15}$ are same or different and are selected from straight or branched chain —$C_1$ to $C_{20}$ alkyl, —$C_1$ to $C_{20}$ alkoxy;

provided when $R_1$, $R_3$ and $R_4$ are methyl then $R_2$ is $C_6$ alkyl;

when $R_2$ is $C_6$ alkyl then $R_1$ is methyl or $C_6$ alkyl.

In preferred embodiment, said squaraine dye of formula (I) is selected from 5-Carboxy-2-[[3-[(1,3-dihydro-1,3,3-trimethyl-2H-indol-2-ylidene)methyl]-2-hydroxy-4-oxo-2-cyclobuten-1-ylidene]methyl]-1,3,3-trimethyl-3H-indolium (SQ1), 5-Carboxy-2-[[3-[(1,3-dihydro-3,3-dimethyl-1-hexyl-2H-indol-2-ylidene)methyl]-2-hydroxy-4-oxo-2-cyclobuten-1-ylidene]methyl]-1,3,3-trimethyl-3H-indolium (SQ2), 5-Carboxy-2-[[3-[(1,3-dihydro-1,3,3-trimethyl-2H-indol-2-ylidene)methyl]-2-hydroxy-4-oxo-2-cyclobuten-1-ylidene]methyl]-3,3-dimethyl-1-hexyl-3H-indolium (SQ3), 5-Carboxy-2-[[3-[(1,3-dihydro-3,3-dimethyl-1-hexyl-2H-indol-2-ylidene)methyl]-2-hydroxy-4-oxo-2-cyclobuten-1-ylidene]methyl]-3,3-dimethyl-1-hexyl-3H-indolium (SQ4), 5-Carboxy-2-[[3-[(1,3-dihydro-1-hexyl-3-decyl-3-octyl-2H-indol-2-ylidene)methyl]-2-hydroxy-4-oxo-2-cyclobuten-1-ylidene]methyl]-1,3,3-trimethyl-3H-indolium (SQ5), 5-Carboxy-2-[[3-[(1,3-dihydro-1,3,3-trimethyl-2H-indol-2-ylidene)methyl]-2-hydroxy-4-oxo-2-cyclobuten-1-ylidene]methyl]-1-hexyl-3-decyl-3-octyl-3H-indolium (SQ6), 5-Carboxy-2-[[3-[(1,3-dihydro-1-hexyl-3-decyl-3-octyl-2H-indol-2-ylidene)methyl]-2-hydroxy-4-oxo-2-cyclobuten-1-ylidene]methyl]-1-hexyl-3-decyl-3-octyl-3H-indolium (SQ7), 4-((5-(6-(2-Carboxy-2-cyanovinyl)-4,8-dimethoxybenzo[1,2-b:4,5-b']dithiophen-2-yl)-1-hexyl-3,3-dimethyl-3H-indol-1-ium-2-yl)methylene)-2-((1-hexyl-3,3-dimethylindolin-2-ylidene)methyl)-3-oxocyclobut-1-en-1-olate (RSQ-1) or 5-[2-Cyano-3-(4,8-bis(2-ethylhexyloxy)benzo[1,2-b:4,5-b]dithiophen-2-yl)acrylic acid]-2-[[3-[(1,3-dihydro-3,3-dimethyl-1-hexyl-2H-indol-2-ylidene)methyl]-2-hydroxy-4-oxo-2-cyclobuten-1-ylidene]methyl]-3,3-dimethyl-1-hexyl-3H-indolium 20d (RSQ2).

The present invention further provides a process for the preparation of squaraine dye of formula (I), wherein said process comprising the steps of:

a) refluxing the reaction mixture of hydrazine compound and 3-alkyl-2-alkanone dissolved in acetic acid at a temperature in the range of 80 to 100° C. for the period in the range of 14 to 16 h to afford corresponding 2-methyl-3,3-dialkyl-3H-indole derivative;
b) refluxing the reaction mixture of alkyl halide and compound of step (a) dissolved in acetonitrile at a temperature in the range of 100 to 110° C. for the period in the range of 14 to 16 h to afford corresponding indolenium salt;
c) heating the reaction mixture of compound of step (b) and 3, 4-dibutoxycyclobut-3-ene-1,2-dione dissolved in solvent in presence of triethylamine at a temperature in the range of 60 to 70° C. for the period in the range of 1 to 2 h to afford semisquaraine compound;
d) refluxing the reaction mixture of compound of step (c) with compound of step (b) dissolved in solvent in presence of pyridine at a temperature in the range of 110 to 115° C. for the period in the range of 20 to 24 h to afford corresponding dye of formula (I), wherein X is —COOH.
e) stirring the reaction mixture of squaraine dye of formula (I) of step (d), benzodithiophene derivative (ixa or ixb), palladium (II) acetate [Pd(OAc)2], tricyclohexylphosphine (PCy3), pivalic acid (PivOH) in presence of potassium carbonate (K2CO3) in toluene at a temperature in the range of 110 to 110° C. for the period in the range of 14 to 16 h to afford aldehyde derivative of SQ-BDT (xa or xb);
f) adding cyanoacetic acid and piperidine to the reaction mixture of compound of step (e) in solvent followed by stirring the reaction mixture at a temperature in the range of 70 to 80° C. for the period in the range of 14 to 16 h to afford dye of formula (I) wherein X is not —COOH.

In one embodiment, said reaction optionally comprises refluxing the semi-squariane compound of step (c) in acetone in presence Hydrochloric acid at temperature in the range of 60 to 80° C. for the period in the range of 6 to 8 h to afford semisqauraic acid.

In preferred embodiment, said hydrazine compound is selected from 4-hydrazinobenzoic acid or phenyl hydrazine hydrochloride.

In another preferred embodiment, said 3-alkyl-2-alkanone is selected from 3-octyltridecan-2-one or 3-methylbut-2-one.

In yet another preferred embodiment, said alkyl halide is alkyl iodide selected from 1-iodohexane or iodomethane.

In still another preferred embodiment, said compound indolenium salt is selected from 1-alkyl-2-methyl-3,3-dialkyl-3H-indol-1-ium iodide and 5-carboxy-1-alkyl-2-methyl-3,3-dialkyl-3H-indol-1-ium iodide such as 1,2,3,3-tetramethyl-3H-indolium iodide (5a); 1-hexyl-2,3,3-tetramethyl-3H-indolium iodide (5b); 5-Carboxy-1,2,3,3-tetramethyl-3H-indolium iodide (6a); 5-Carboxy-1-hexyl-2,3,3-trimethyl-3H-indolium iodide (6b); 1-hexyl-2-methyl-3-decyl-3-octyl-3H-indolium iodide (7a) or 5-carboxy-1-hexyl-2-methyl-3-decyl-3-octyl-3H-indolium iodide (7b).

In yet still another preferred embodiment, said semisquaraine compound is selected from (E)-2-((2-butoxy-3,4-dioxocyclobut-1-en-1-yl)methylene)-1,3,3-trimethyl-indoline (8), (E)-2-((2-butoxy-3,4-dioxocyclobut-1-en-1-yl)methylene)-1-hexyl-3,3-dimethyl-indoline (9), (E)-2-((2-butoxy-3,4-dioxocyclobut-1-en-1-yl)methylene)-1,3,3-trimethyl-indoline-5-carboxylic acid (10), (E)-2-((2-butoxy-3,4-dioxocyclobut-1-en-1-yl)methylene)-1-hexyl-3-decyl-3-octyl-indoline-5-carboxylic acid (11).

In yet still another preferred embodiment, said 2-methyl-3,3-dialkyl-3H-indole derivative is selected from 2-methyl-3,3-dialkyl-3H-indole such as 2,3,3-trimethyl-3H-indole (3a), 2,3,3-trimethyl-3H-indole-5-carboxylic acid (4a) or 2-methyl-3,3-dialkyl-3H-indole-5-carboxylic acid such as 2-methyl-3-decyl-3-octyl-3H-indole (3b) or 2-methyl-3-decyl-3-octyl-3H-indole-5-carboxylic acid (4b).

In yet still another preferred embodiment, said process is carried out under nitrogen atmosphere.

In yet still another preferred embodiment, said solvent in step (c) and (d) is selected from 1-butanol, toluene or mixture thereof.

In yet still another preferred embodiment, said solvent in step (f) is selected from chloroform, acetonitrile or mixture thereof.

A series of indole-based unsymmetrical squaraine (SQ) dyes that contain alkyl chains at N- and branched alkyl chains at $sp^3$ C-atoms of indole moieties are synthesized. The optical and electrochemical properties of the SQ dyes are unchanged as there is no change in the conjugated π-surface unit, however, remarkable changes with respect to the power conversion efficiencies are observed. Introduction of alkyl groups on the indole unit that is far away from anchoring unit helps in more dye loading, avoiding the aggregation, increased charge transfer resistance, increased electron life time and hence more power conversion efficiency than the corresponding isomer in which the funtionalized indole unit contains the anchoring group. A DSSC device made out of SQ5 gave the Voc of 660 mV and Jsc of 19.82 mA/$cm^2$, and efficiency 9.01%, respectively. This present investigation revealed the importance of position of alkyl groups in the squaraine based dyes for the better power conversion efficiency.

Figure 7:
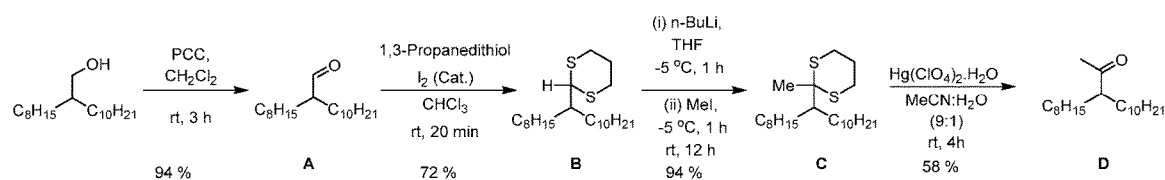
FIG. 7: Synthesis of branched ketone

The synthesis of un-symmetrical squaraine dyes requires semi-squariane and the indoline base. Suitably substituted indoline moiety with branched alkyl chain requires condensation of branched methyl ketone and the phenylhydrazine derivative. The branched methyl ketone is synthesized by adopting dithiane route, branched aldehyde is converted in to the corresponding dithiane by iodine catalyzed reaction with 1,3-propanedithiol, and the corresponding dithiane is methylated under n-BuLi reaction condition, subsequent mercuric perchlorate mediated deprotection provided the branched methylketone in moderate yield. The synthesis of branched ketone is as depicted in FIG. 7.

Figure 8:
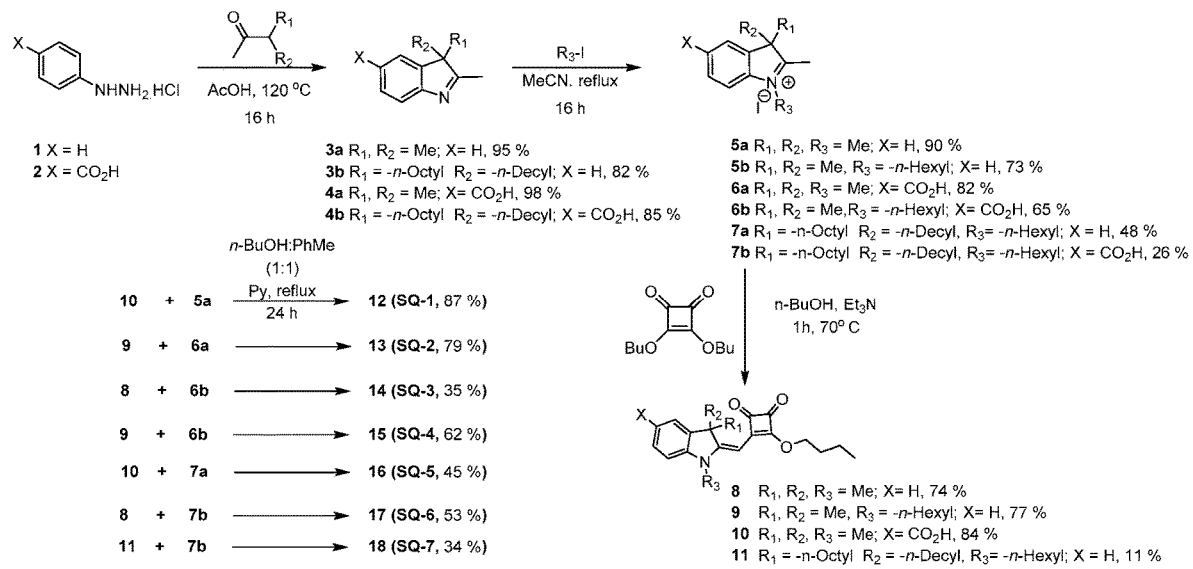
FIG. 8: Synthesis of un-symmetrical squaraine dyes SQ1-SQ7.

The synthesis of squaraine dyes (SQ1-SQ7) with systematic variation in the position of alkyl groups is as depicted in FIG. 8.

Figure 9:
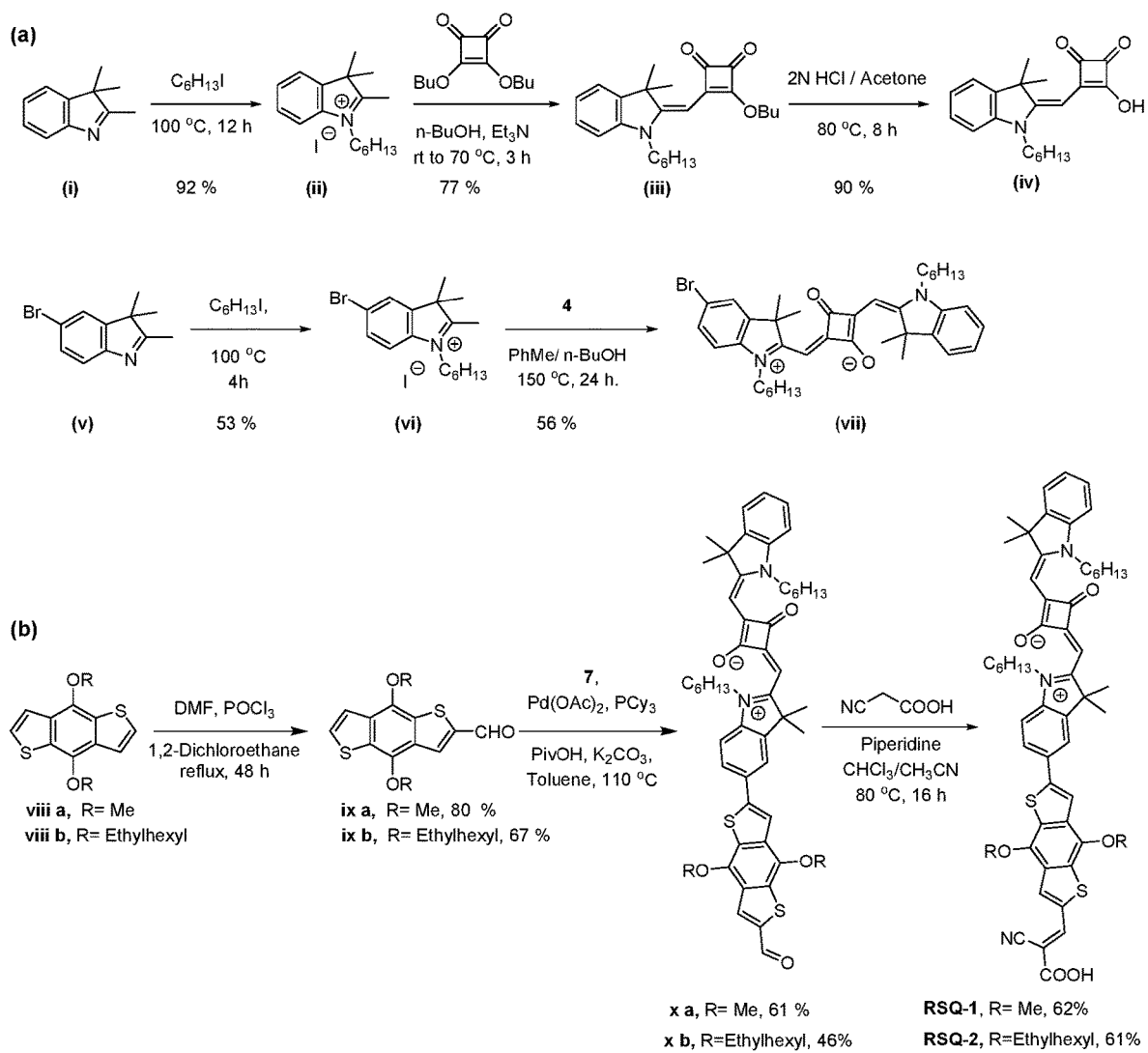
FIG. 9: Synthesis of RSQ1 and RSQ2

In preferred embodiment, the process for the preparation of 4-((5-(6-(2-Carboxy-2-cyanovinyl)-4,8-dimethoxybenzo[1,2-b:4,5-b']dithiophen-2-yl)-1-hexyl-3,3-dimethyl-3H-indol-1-ium-2-yl)methylene)-2-((1-hexyl-3,3-dimethylindolin-2-ylidene)methyl)-3-oxocyclobut-1-en-1-olate (RSQ-1) and 5-[2-Cyano-3-(4,8-bis(2-ethylhexyloxy)benzo[1,2-b:4,5-b]dithiophen-2-yl)acrylic acid]-2-[[3-[(1,3-dihydro-3,3-dimethyl-1-hexyl-2H-indol-2-ylidene)methyl]-2-hydroxy-4-oxo-2-cyclobuten-1-ylidene]methyl]-3,3-dimethyl-1-hexyl-3H-indolium (RSQ2) is as depicted in FIG. 9.

The UV-Vis spectrum of SQ dyes in $CH_2Cl_2$ showed absorption maximum at 640 nm for SQ1 with a distinct π-π* transition, and introducing alkyl groups on the $sp^3$ carbon and N-atoms of the bottom (indoline moiety that contains the carboxylic acid group) and top or both indoline moieties causes 5-12 nm red shifted vibronic band for the dyes SQ2-SQ7 with the extinction coefficients of 1-2×$10^5$ $M^{-1}$ $cm^{-1}$ (FIG. 1).

Fluorescence spectrum showed the emission maximum at 650-660 nm. The fluorescent life times have been measured for the SQ dyes, and they are improved in the dyes SQ5-SQ7 (Table 1).

TABLE 1

Photophysical and electrochemical characterization of SQ1 to SQ7 at rt.[a]

| Dye | $\lambda_{max}$ (nm)[a] | $\varepsilon$ ($10^5$ $M^{-1}$ $cm^{-1}$) | $\lambda_{max}$ (nm) | $\Phi$[b] | Life time[c] $\tau_{1\,(ns)}$ | $\tau_{2\,(ns)}$ | $\chi^2$ | $E_{HOMO}$ (eV) | $E_{LUMO}$ (eV)[d] | $E_g$ (eV) |
|---|---|---|---|---|---|---|---|---|---|---|
| SQ-1 | 640 | 1.4 | 651 | 0.1 | 0.44 (79%) | 0.89 (21%) | 1.04 | −4.84 | −2.99 | 1.85 |
| SQ-2 | 641 | 2.1 | 650 | 0.09 | 0.43 (65%) | 0.82 (35%) | 1.00 | −4.82 | −2.97 | 1.85 |
| SQ-3 | 643 | 1.84 | 652 | 0.1 | 0.51 (72%) | 1.03 (28%) | 1.26 | −4.83 | −2.99 | 1.84 |
| SQ-4 | 646 | 2.09 | 658 | 0.12 | 0.58 (58%) | 1.16 (42%) | 1.17 | −4.85 | −3.02 | 1.83 |
| SQ-5 | 644 | 2.1 | 652 | 0.15 | 0.67 (43%) | 1.23 (57%) | 1.02 | −4.83 | −2.99 | 1.84 |
| SQ-6 | 647 | 2.2 | 654 | 0.15 | 0.57 (47% | 1.23 (53%) | 1.18 | −4.82 | −2.98 | 1.84 |
| SQ-7 | 652 | 1.0 | 660 | 0.3 | 0.29 (10%) | 1.78 (90%) | 1.07 | −4.82 | −2.99 | 1.83 |

Figure 2:
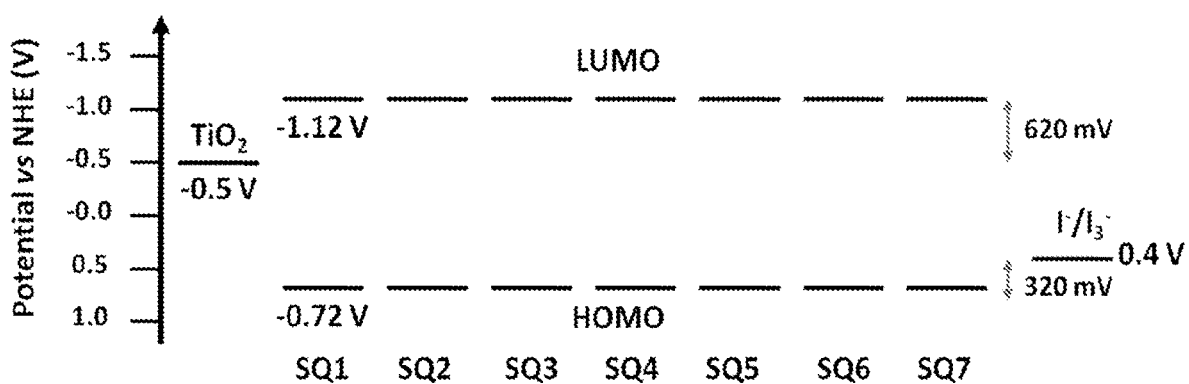
FIG. 2: Energy level diagram for SQ1-SQ7

[a]In $CH_2Cl_2$,
[b]excitation wavelength 610 nm and relative method using a SQ based dye[ref],
[c]TCSPC method excitation wavelength 635 nm,
[d]$E_{Lumo} = E_{Homo} + E\text{-}00$ The oxidation potentials correspond to HOMO level of SQ dyes (0.71-0.74 vs NHE) are significantly more positive than the liquid electrolyte $I^-/I_3^-$ redox potential LUMO energy level is estimated by HOMO and $E_{0-0}$ levels that is calculated from the intersecting point in which normalized absorption and emission spectra are overlapped. The LUMO level of SQ dyes are (−1.09 to −1.14) also more negative than the $E_{CB}$ for thermodynamically favoured electron injection (FIG. 2). The cyclic voltametric studies showed that the HOMO and LUMO level for the SQ1 is −0.72 eV and −1.12 eV and the energy levels are not affected for the various substituted SQ2-SQ7 dyes.

In still another embodiment, the present invention provides an electronic device comprising a squaraine dye of formula (I).

In preferred embodiment, said device is a solar cell.

In another preferred embodiment, said solar cell is a dye-sensitized solar cell, and said dye is chemisorbed to a photoactive semiconductor porous material in said dye-sensitized solar cell.

In yet another preferred embodiment, said dye is present in solution or wherein said dye is present in a film.

In yet another preferred embodiment, the solar cell efficiency of above solar cell device is in the range of 2.5 to 9.5%.

In one embodiment, said device further comprises at least one other dye.

The photovoltaic device performances of SQ1-7 dyes under standard conditions (1.5 G, 100 mW/cm²) are measured using iodine ($I^-/I_3^-$) liquid electrolyte. The DSSC device parameters of SQ based dyes are summarized in Table 3. A DSSC device based on SQ2 with a N-hexyl chain far away from $TiO_2$ surface gave a short-circuit photocurrent density (Jsc) of 12.56 mA/cm², an open-circuit photovoltage ($V_{oc}$) of 0.649 V, a fill factor of 71.5% and a PCE of 5.8%. When the N-hexyl group placed near to $TiO_2$ surface, i.e., N-hexyl chain in indolidine unit that contains the $TiO_2$ anchoring carboxylic acid group as in SQ3 showed significant reduction in Voc, Jsc and the overall device efficiency (Jsc 9.05 mA/cm2, Voc 0.61 V, ff-70.1% and η=3.85%). When both the top (which is away from the $TiO_2$ surface) and bottom (near to the $TiO_2$ surface possessing carboxylic acid groups) indolidine units alkylated with hexyl groups, the resultant dye SQ4 showed an improvement of Voc, slight reduction of Jsc, and gave a better efficiency of 4.36% in compared to SQ3 over SQ2. In dyes SQ2-4, in-plane N-alkylation of indolidine moieties may inhibit the electrolyte to reach $TiO_2$ surface besides partly avoiding the dye aggregation.

TABLE 2

Photovoltaic parameters of SQ1-SQ7

| Cell Specification[a] | Voc [V] | Jsc [mA/cm²] | ff [%] | η [%] | τ (ms) |
|---|---|---|---|---|---|
| SQ-1 | 0.571 | 7.44 | 68.6 | 2.91 | 0.16 |
| SQ-1 (CDCA 20 equiv.) | 0.582 | 8.72 | 70.8 | 3.59 | 0.30 |
| SQ-2 | 0.610 | 10.44 | 69.0 | 4.39 | 1.05 |
| SQ-2 (CDCA, 20 equiv.) | 0.649 | 12.5 | 71.5 | 5.80 | 2.26 |
| SQ-3 | 0.594 | 8.61 | 68.3 | 3.49 | 0.41 |
| SQ-3 (20 equiv.) | 0.607 | 9.05 | 70.1 | 3.85 | 1.66 |
| SQ-4 | 0.623 | 8.94 | 69.3 | 3.85 | 0.42 |
| SQ-4 (10 equiv.) | 0.623 | 10.16 | 69 | 4.36 | 2.26 |
| SQ-5 | 0.636 | 18.05 | 67.4 | 7.74 | 2.64 |
| SQ-5 (5 equiv.) | 0.660 | 19.82 | 68.9 | 9.01 | 3.59 |
| SQ-6 | 0.633 | 12.41 | 67.7 | 5.32 | 1.94 |
| SQ-6 (5 equiv.) | 0.647 | 14.23 | 68.6 | 6.31 | 2.26 |
| SQ-7 | 0.649 | 14.06 | 68.2 | 6.22 | 2.64 |
| SQ-7 (5 equiv.) | 0.650 | 16.88 | 69.7 | 7.64 | 3.59 |

[a]8 + 4 mm $TiO_2$ thickness

The dyes SQ5-SQ7 possess the branched alkyl groups in either one or both the indolidine units, and DSSC device showed SQ5 (7.74%), SQ6 (5.32%) and SQ7 (6.22%) showed moderate PCE without any CDCA and the Voc is significantly increased (FIG. 3, and FIG. 4) in the presence of co-adsorbent. Again, it is observed that out-of-plane branching at the top indolidine moiety plays an important role as SQ5 gave a Jsc of 19.82 mA/cm2, an open-circuit photovotage of 660 mV, Whereas SQ6 dye showed Jsc and Voc of 12.41 mA/cm2 and 0.63 V, respectively. In the case of SQ7, significant improvement of PCE from 6.22% to 7.64% upon co-adsorbed with CDCA.

Figure 3:
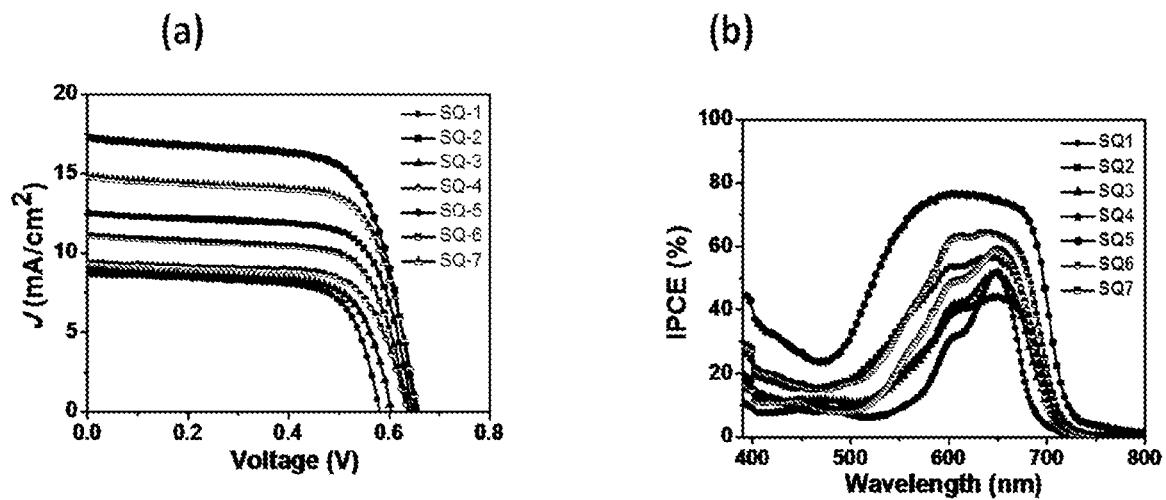
FIG. 3: I-V plots for the (top left without CDCA, top right with CDCA) and IPCE profile (down left without CDCA, down right with CDCA) for the dyes SQ1-SQ7

The IPCE response for the dyes SQ1-7 are studied in the presence and absence of the co-adsorbent CDCA, and presented in FIG. 3. In the absence of CDCA, the observed IPCE responses are broad and have a maximum in 540-555 nm, 570-620 nm and 638-668 nm regions. Dyes other than SQ1, SQ2 and SQ5, contributed to 570-620 nm and 638-668 nm regions. The regions 540-555 nm, 570-620 nm are correspond to the H-aggregated assembly of the dyes on $TiO_2$ surface and the region 638-668 nm corresponds to the monomeric dye. Dyes SQ5, SQ2 and SQ1 contributed 66.2% (5556 nm), 43.32% (552 nm) and 35% (541 nm), respectively, which are higher than the contribution from aggregated and monomeric dye. Between SQ2 and SQ5, introducing a sp3-branching unit helps in increasing the efficiency about 1.5 times higher for SQ5 (9.1%) than SQ2 (5.8%).

Figure 4:
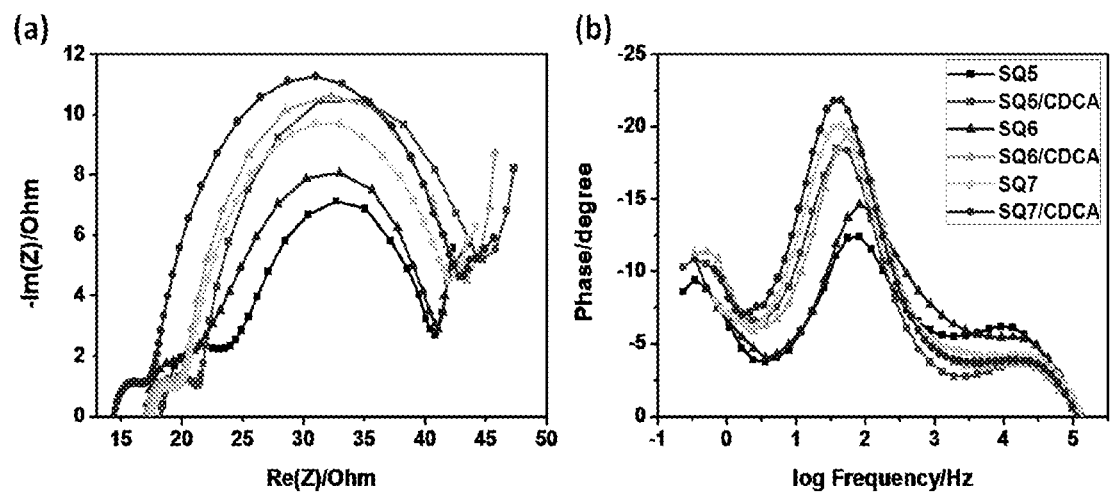
FIG. 4: EIS study on the SQ5-SQ7 dyes (a) Nyquist plot and (b) Bode plot

EIS analysis data were acquired under 1 sun illumination (100 mW/cm$^2$) to emphasise the effect of linear and branched alkyl group's position on the performance of SQ series (SQ1 to 7). The second semicircle at the intermediate frequency region of Nyquist plot FIG. 4 (a) ascribed to charge recombination resistance between $CB_{TiO2}$ and electrolyte, and corresponding peak frequency (f) observed in Bode phase plot FIG. 4 (b) represents the electron life time ($\tau$) in $TiO_2$ film and it was derived from equation $\tau=(2\pi f)^{-1}$. For clear comparison, SQ2 and SQ5, SQ3 and SQ6, and SQ4 and SQ7 are classified as top-alkyl, bottom-alkyl, and top and bottom alkyl respectively. Among SQ series, SQ5 and SQ7 showed maximum $V_{OC}$ and long electron life time ($\tau$=3.59 ms), and least for SQ1 (t=0.16 ms). Interestingly, dye cell without any co-adsorbent, $\tau$ value of top-alkyl SQ2 and SQ5 were showed superior result than SQ3 and SQ6 (the bottom alkyl counterpart), and for all SQ dyes with and without co-adsorbent the result summarized in Table 2. In case of N-alkylated molecules without CDCA the values of $f$ decreased in the order of SQ2 (151.99 Hz)<SQ3 (383.64 Hz)=SQ3 (383.64 Hz) and with CDCA SQ4 (60.25 Hz)<SQ2 (70.29 Hz)<SQ3 (95.76 Hz), and SQ2 showed maximum $\tau$ value of 1.05 ms in the first case and 2.64 ms (SQ4) for the later. As shown in FIG. 4b, for sp$^3$-alkylated without CDCA, $\tau$ increased in the order of SQ5=SQ7 (2.64 ms) >SQ6 (1.94 ms), and with CDCA SQ5=SQ7 (3.59 ms)>SQ6 (2.26 ms). After all, the life time of injected electron at $TiO_2$/Iodolyte interface is governed by varying the position of alkyl groups on simple squaraine structure and for the highest efficiency cell (SQ5 with 5 eqv. CDCA) $V_{OC}$ and $\tau$ are 0.66 V and 3.59 ms, respectively, with PCE of 9.1%. Apparently, EIS analysis of SQ dyes helped to deduce the correlation between alkyl group's position on the SQ backbone and cell potential by measuring the characteristics frequency of Bode phase plot that represents impedance due to electron transfer from $CB_{TiO2}$ to triiodide ions at the interface.

Figure 5:
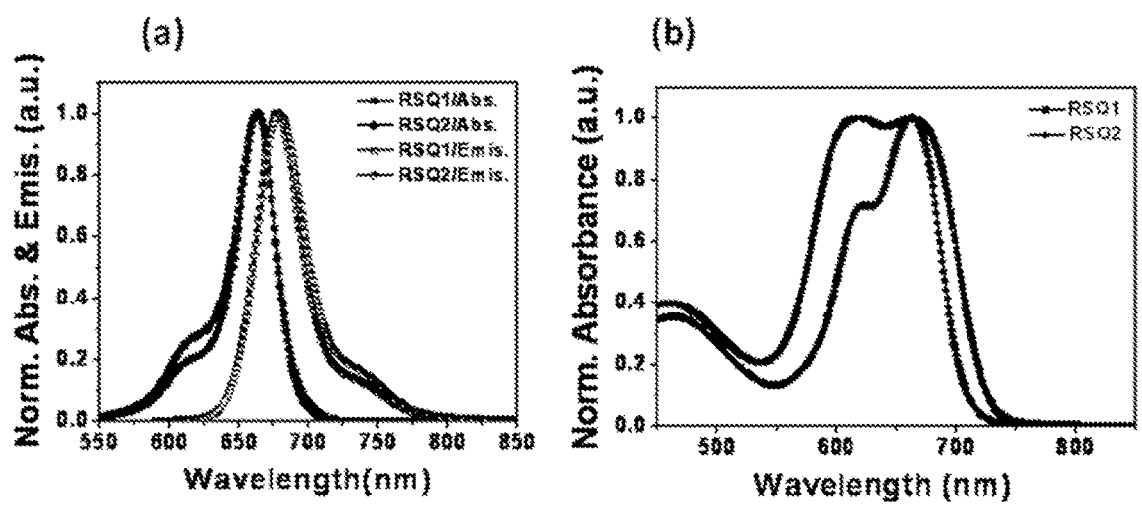
FIG. 5: (a) Absorption and emission spectra of RSQ dyes in CHCl3 solution. (b) Normalized absorbance of RSQ dyes adsorbed at the surface of 6 μm thick $TiO_2$ film (Dye concentration=0.1 mM in CH2Cl2, dipping time 30 min).

The UV-vis absorption and emission spectra of RSQ1 and RSQ2 in CHCl$_3$ solution are shown in FIG. 5a, and UV-vis spectra of RSQ dyes adsorbed on transparent mesoporous TiO2 film is shown in FIG. 5b. The absorption spectra of both the dyes in solution exhibit intense absorption band in the range of 500 nm to 700 nm. They have $\lambda$max at 664 nm corresponding to intramolecular charge transfer (ICT) transition, with a high molar absorption coefficient ($\epsilon$) of 2.18× 105 and 2.39×105 M$^{-1}$ cm$^{-1}$ for RSQ1 and RSQ2 respectively.

Figure 6:
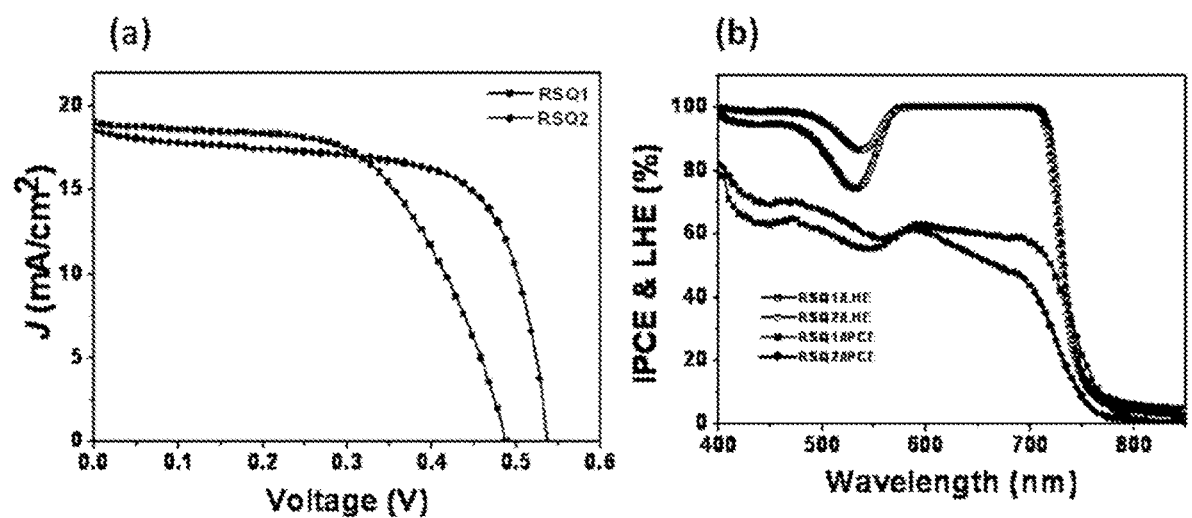
FIG. 6: (a) J-V curve and (b) IPCE spectrum and LHE spectrum of RSQ sensitizers without coadsorbent. ([Dye] =0.1 mM, in CH2Cl2, dipping time 5 h, TiO2 active area=0.22 cm²).

The photovoltaic performance of DSSC based on RSQ1-2 dyes are evaluated under simulated AM 1.5 G illumination (100 mW cm$^{-2}$). The current density-voltage (J-V) characteristics of DSSCs are shown in FIG. 6a and device performance data with and without coadsorbent are summarized in Table 3. RSQ2 sensitized cells showed better performance in comparison to RSQ1 without CDCA and achieved an overall power conversion efficiency (i) of 6.72% with a Jsc of 18.53 mAcm$^{-2}$, fill factor (f f) of 67.4% and Voc of 0.538 V. RSQ1 sensitized solar cells gave PCE of 5.43%, Jsc of 19.03 mAcm$^{-2}$, ff of 58.3% and Voc of 0.490 V. The greater PCE of RSQ2 is due to better Voc and fill factor (ff) in comparison to RSQ1. Both enhancement in Voc and ff in RSQ2 could be attributed to controlled assembly of these dyes on $TiO_2$ surface.

TABLE 3

Photovoltaic Performance of RSQ Dyes with CDCA and without CDCA under 1 Sun Illumination

| SQ dyes | Voc (V) | Jsc (mA/cm$^2$) | ff (%) | $\eta$ (%)$^a$ |
|---|---|---|---|---|
| RSQ1 | 0.490 | 19.03 | 58.3 | 5.43 |
| RSQ1/CDCA (1 equiv) | 0.488 | 18.25 | 59.4 | 5.29 |
| RSQ2 | 0.538 | 18.53 | 67.4 | 6.72 |
| RSQ2/CDCA (1 equiv) | 0.539 | 18.77 | 67.7 | 6.84 |

$^a$Photovoltaic performance of RSQ cells, thickness of electrode: 8 + 4 µm (transparent + scattering) layer of TiO2, Electrolyte: 0.5M DMII, 0.1M LiI, 0.1M I2 and 10 mM TBP in CH3CN. [Dye] = 0.1 mM in CH$_2$Cl$_2$, dipping time was 5 h, Active area of 0.22 cm$^2$ and measurements were carried out under 1 sun intensity (100 mW/cm$^2$).

EXAMPLES

Following examples are given by way of illustration and therefore should not be construed to limit the scope of the invention.

Required precursors 3a,$^{S1}$ 4a,$^{S2}$ 5a,$^{S3}$ 5b,$^{S4}$ 6a,$^{S2}$ 6b$^{S5}$ and 8$^{S1}$ were synthesized according to the reported literature procedure.

Example 1: Synthesis of 3-octyltridecan-2-one (Branched Ketone)

a) 2-Octyldodecanal (A)

2-Octyl-1-dodecanol (5 g, 16.7 mmol) was taken in a 100 mL round bottomed flask, pyridiniumchlorochromate (10.8 g, 50.24 mmol) was added to it and the mixture was dissolved in anhydrous CH$_2$Cl$_2$ (120 mL). The reaction mixture was stirred at room temperature (27° C.) for 3 h and filtered through a short pad of silica gel to provide the required aldehyde as a colourless liquid. 4.68 g, Yield: 94%. $^1$H NMR (400 MHz, CDCl$_3$) δ: 9.54 (d, J=3.2 Hz, 1H), 2.26-2.14 (m, 1H), 1.68-1.53 (m, 2H), 1.42 (dd, J=14.2, 5.6 Hz, 2H), 1.25 (broad s, 28H), 0.87 (t, J=6.8 Hz, 6H); $^{13}$C NMR (100 MHz, CDCl$_3$) δ: 211.9, 182.8, 161.1, 77.3, 77.2, 76.7, 74.6, 72.1, 45.5, 42.8, 37.4, 34.0, 32.2, 31.9, 31.8, 29.7, 29.6, 29.6, 29.5, 29.5, 29.3, 29.3, 29.3, 29.1, 27.4, 25.6, 25.2, 23.9, 22.7, 14.1; MALDI-TOF (m/z): [M]$^+$ calcd for C$_{20}$H$_{40}$O: 296.3079; found: 296.2517.

b) 2-(Nonadecan-9-yl)-1,3-dithiane (B)

2-Octyldodecanal (5 g, 16.8 mmol) was dissolved in 25 mL of chloroform in a 100 mL round bottomed flask and cooled to 0° C. Propane-1,3-dithiol (2 mL, 20.2 mmol) and I$_2$ (25 mg, cat.) were added and reaction mixture was stirred for 20 min at room temperature (27° C.). The reaction mixture was quenched with 0.1 M solution of sodium thiosulphate (50 mL), diluted with CH$_2$Cl$_2$ (100 mL), washed with 10% NaOH (20 mL) followed by H$_2$O (3×200 mL) and then dried with Na$_2$SO$_4$. The crude product was purified using silica gel column and CH$_2$Cl$_2$: hexane as eluents. 4.4 g, Yield: 72%. $^1$H NMR (400 MHz, CDCl$_3$) δ: 4.22 (d, J=3.4 Hz, 1H), 2.93-2.74 (m, 4H), 2.14-2.04 (m, 1H), 1.67-1.51 (m, 3H), 1.25 (broad s., 30H), 0.86 (t, J=6.4 Hz, 6H); $^{13}$C NMR (100 MHz, CDCl$_3$) δ: 77.3, 76.7, 54.1, 43.7, 31.9, 31.2, 31.2, 29.7, 29.6, 29.6, 29.5, 29.5, 29.3, 29.3, 27.5, 26.5, 22.6, 14.1; MALDI-TOF (m/z): [M]+ calcd for $C_{23}H_{47}S_2$: 387.3110; found: 387.1503.

c) 2-Methyl-2-(nonadecan-9-yl)-1,3-dithiane(C)

2-(Nonadecan-9-yl)-1,3-dithiane (1.12 g, 2.8 mmol) was dissolved in dry THF (15 mL) in a 50 mL two necked round bottomed flask and cooled to −5° C. n-BuLi (1.4 mL, 2.5 M solution in hexane, 3.47 mmol) was added and stirred for 1 h. Methyl iodide (0.22 mL, 3.48 mmol) was added drop wise and stirred for 30 min at −5° C. The reaction mixture was brought to room temperature (27° C.) and stirred further for 15 h. The reaction was quenched with saturated $NaHCO_3$ solution (50 mL), extracted with $CH_2Cl_2$ (3×20 mL) and then dried with $Na_2SO_4$. The reaction mixture was purified by silica gel column and $CH_2Cl_2$: hexane as eluents to afford the required product as colourless oil. 1.09 g, Yield: 94%. H NMR (400 MHz, $CDCl_3$) δ: 2.96-2.81 (m, 2H), 2.81-2.55 (m, 2H), 2.03-1.79 (m, 3H), 1.66 (d, J=7.3 Hz, 1H), 1.58 (s, 2H), 1.25 (broad s., 32H), 0.87 (t, J=5.6 Hz, 6H); $^{13}C$ NMR (100 MHz, $CDCl_3$) δ: 77.3, 76.7, 60.2, 55.3, 54.1, 46.7, 44.5, 43.8, 35.4, 32.7, 32.0, 31.9, 31.7, 31.6, 31.4, 31.2, 31.2, 30.1, 30.0, 29.8, 29.6, 29.5, 29.5, 29.3, 29.0, 27.7, 27.5, 27.0, 26.5, 26.4, 26.3, 25.9, 25.5, 25.4, 24.1, 23.1, 22.7, 22.5, 14.1 MALDI-TOF (m/z): [M]+ calcd for $C_{24}H_{49}S_2$: 401.3275; found: 401.1729.

d) 3-Octyltridecan-2-one(D)

2-Methyl-2-(nonadecan-9-yl)-1,3-dithiane (1.3 g, 0.28 mmol) was dissolved in acetonitrile/water (9:1, 10 mL) in a 100 mL round bottomed flask and $Hg(ClO_4)_2.H_2O$ (1.56 g, 3.9 mmol) was added into it and stirred for 12 h. The reaction mixture was filtered through Whatman filter paper and 5% aqueous $NaHCO_3$ solution (50 mL) was added to the filtrate, extracted with $CH_2Cl_2$ (3×20 mL). The organic layer was dried over $Na_2SO_4$, concentrated under reduced pressure, and purified by silica gel column using $CH_2Cl_2$: hexane as eluents to afford the required product as colourless oil. 0.58 g, Yield: 58%. $^1H$ NMR (400 MHz, $CDCl_3$) δ: 2.41 (m, 1H), 2.09 (s, 3H), 1.61-1.48 (m, 2H), 1.43-1.33 (m, 2H), 1.23 (br. S., 28H), 0.86 (t, J=6.8 Hz, 6H); $^{13}C$ NMR (100 MHz, $CDCl_3$) δ=213.2, 77.3, 76.7, 53.3, 31.9, 31.8, 31.7, 31.6, 29.7, 29.6, 29.4, 29.4, 29.3, 29.2, 28.6, 27.4, 22.6, 22.6, 14.1; MALDI-TOF (m/z): [M+Na]+ cald for $C_{24}H_{49}S_2$: 333.32; found: 333.2532.

Example 2: General procedure for the synthesis of 2-methyl-3,3-dialkyl-3H-indole (3a, 4a) and 2-methyl-3,3-dialkyl-3H-indole-5-carboxylic acid (3b, 4b)

4-Hydrazinobenzoic acid (1 equiv.) or phenyl hydrazine hydrochloride, corresponding 3-alkyl-2-alkanone (2 equiv.) were dissolved in acetic acid (50 mL) in a 100 mL round bottom flask. The reaction mixture was heated to reflux at 100° C. for 16 h under nitrogen atmosphere. The reaction mixture was cooled and the solvent acetic acid was removed under reduced pressure and washed with petroleum ether to provide the required compound as a brown color solid.

3b: 0.3 g, Yield: 82%; $^1H$ NMR ($CDCl_3$, 200 MHz) δ: 7.51 (dd, J=8 Hz, 2 Hz, 1H), 7.33-7.27 (m, 1H), 7.18 (d, J=8 Hz, 2H), 2.20 (s, 3H), 1.94-1.62 (m, 4H), 1.16 (b, 26H), 0.89-0.83 (m, 6H), 0.70-0.5 (m, 2H); $^{13}C$ NMR ($CDCl_3$, 100 MHz) δ: 186.5, 154.3, 141.9, 128.6, 127.1, 124.7, 121.3, 119.1, 62.3, 53.0, 41.6, 36.7, 31.6, 31.5, 31.4, 31.3, 29.4, 29.3, 29.2, 29.1, 29.0, 28.9, 28.8, 28.7, 28.3, 27.2, 27.1, 23.5, 23.2, 22.3, 22.2, 15.7, 13.8, 13.7; HRMS (m/z): [M−H]+ calcd for $C_{27}H_{44}N$: 382.3468; found: 382.3471.

4b: 0.56 g, Yield: 85%; $^1H$ NMR ($CDCl_3$, 200 MHz) δ: 8.15 (d, J=8.4 Hz, 1H), 7.96 (s, 1H), 7.64 (d, J=8.4 Hz, 1H), 2.29 (s, 3H), 1.99-191 (m, 2H), 1.80-1.73 (m, 2H), 1.29-1.21 (b, 26H), 0.88-0.84 (m, 6H), 0.75-0.5 (m, 2H); $^{13}C$ NMR ($CDCl_3$, 100 MHz) δ: 191.1, 171.1, 142.2, 130.8, 123.1, 119.1, 53.0, 31.6, 31.5, 31.4, 31.3, 30.6, 29.4, 29.3, 29.1, 29.0, 28.9, 28.8, 28.4, 28.3, 27.2, 27.1, 25.3, 24.3, 24.3, 24.1, 23.6, 23.3, 22.3, 22.2, 22.1, 15.9, 13.8, 13.6; HRMS (m/z): [M+H]+ calcd for $C_{28}H_{46}NO_2$:428.3523; found: 428.3527.

Example 3: General procedure for the synthesis of 1-alkyl-2-methyl-3,3-dialkyl-3H-indol-1-ium iodide and 5-carboxy-1-alkyl-2-methyl-3,3-dialkyl-3H-indol-1-ium iodide (5a, 5b, 6a, 6b, 7a and 7b)

Alkyl iodide (2 equiv.) and corresponding 2-methyl-3,3-dialkyl-3H-indole derivative (1 equiv.) were dissolved in MeCN (60 mL) in a 100 mL round bottom flask and refluxed at 100° C. for 16 h under inert atmosphere. The reaction mixture was cooled to room temperature (27° C.); the solvent was removed under reduced pressure. The precipitate was washed with diethyl ether (4×5 mL) to afford the required compound as a red color liquid in case of 7.

7a: 0.22 g, Yield: 60%; $^1H$ NMR ($CDCl_3$, 200 MHz) δ: 7.73-7.60 (m, 3H), 7.53-7.47 (m, 1H), 4.89 (t, J=7.6 Hz, 2H), 3.15 (s, 3H), 2.25-2.05 (m, 4H), 2.01-1.69 (m, 2H), 1.68-1.45 (m, 2H), 1.41-1.29 (m, 4H), 1.28-1.03 (b, 26H), 0.85 (m, 9H), 0.64 (m, 2H); HRMS (m/z):[M−H]+ calcd for $C_{33}H_{58}IN$: 594.3530; found: 594.3533.

7b:0.18 g, Yield: 26%; $^1H$ NMR ($CDCl_3$, 200 MHz) δ: 8.36 (d, J=8.4 Hz, 1H), 8.19 (s, 1H), 7.87 (d, J=8.4 Hz, 1H), 4.94 (t, J=8 Hz, 2H), 3.19 (s, 3H), 2.30-2.01 (m, 4H), 1.96-1.82 (m, 2H), 1.56-1.46 (m, 2H), 1.42-1.09 (b, 30H), 0.87-0.83 (m, 9H), 0.70 (m, 2H); HRMS (m/z):[M−H]+ calcd for $C_{34}H_{58}INO_2$:638.3512; found: 638.3445.

Example 4: Synthesis of (E)-2-((2-butoxy-3,4-dioxocyclobut-1-en-1-yl)methylene)-1,3,3-trialkyl-indoline (8, 9, and 11) and (E)-2-((2-butoxy-3,4-dioxocyclobut-1-en-1-yl)methylene)-1,3,3-trialkyl-indoline-5-carboxylic acid (10)

The corresponding indolium iodide (1 equiv.) and 3,4-dibutoxycyclobut-3-ene-1,2-dione (1 equiv) were dissolved in 1-butanol in a 50 mL two necked round bottomed flask and triethylamine (1.2 equiv) was added into the reaction mixture. The reaction mixture was heated at 70° C. for 1 h under nitrogen atmosphere. The reaction mixture cooled to room temperature, and the solvents were removed under reduced pressure. The reaction mixture was purified by column chromatography ($SiO_2$, 100-200 mesh) 5% EtOAc and 95% petroleum ether to afford the required compound as a yellow solid.

(E)-2-((2-butoxy-3,4-dioxocyclobut-1-en-1-yl)methylene)-1,3,3-trimethyl-indoline (8)

1.6 g, Yield: 74%; $^1H$ NMR ($CDCl_3$, 200 MHz) δ: 7.29-724 (m, 2H), 7.07 (t, J=7.4 Hz, 1H), 6.88 (d, J=7.24 Hz, 1H), 5.36 (s, 1H), 4.85 (t, J=6.6 Hz, 2H), 3.37 (s, 3H), 1.95-1.79 (m, 2H), 1.61 (s, 6H), 1.58-1.42 (m, 2H), 1.01 (t, J=7.2 Hz, 3H); $^{13}C$ NMR ($CDCl_3$, 50 MHz) δ: 192.7, 187.5, 173.5, 168.3, 142.6, 140.9, 127.7, 122.6, 121.9, 108.4, 81.2, 73.7, 47.9, 43.0, 32.1, 31.4, 26.9, 26.6, 26.2, 22.4, 18.7, 13.9,

(E)-2-((2-butoxy-3,4-dioxocyclobut-1-en-1-yl)methylene)-1-hexyl-3,3-dimethyl-indoline (9)

2.75 g, Yield: 77%; $^1$H NMR (CDCl$_3$, 200 MHz) δ: 7.3-7.23 (m, 2H), 7.08 (t, J=7.0 Hz, 1H), 6.87 (d, J=8.0 Hz, 1H), 5.41 (s, 1H), 4.86 (t, J=6.4 Hz, 2H), 3.81 (t, J=7.4 Hz, 2H), 1.9-1.62 (m, 4H), 1.61 (s, 6H), 1.60 (s, 6H), 1.60-1.32 (m, 8H), 1.00 (t, J=7.2 Hz, 3H), 0.9 (t, J=7.0 Hz, 3H); $^{13}$C NMR (CDCl$_3$, 50 MHz) δ: 192.6, 187.8, 173.5, 169.0, 143.0, 140.7, 127.7, 122.7, 121.9, 108.1, 81.4, 73.8, 63.1, 47.8, 32.1, 29.9, 26.9, 18.7, 13.7; HRMS (m/z): [M+H]$^+$ calcd for C$_{25}$H$_{34}$NO$_3$:396.2533; found: 396.2533.

(E)-2-((2-butoxy-3,4-dioxocyclobut-1-en-1-yl)methylene)-1,3,3-trimethyl-indoline-5-carboxylic acid (10)

0.53 g, Yield: 50%; $^1$H NMR (CDCl$_3$, 200 MHz) δ: 8.09 (dd, J=12.4, 1.6 Hz, 1H), 7.98 (d, J=1.6 Hz, 1H), 6.92 (d, J=8.4 Hz, 1H), 5.46 (s, 1H), 4.87 (t, J=6.6 Hz, 2H), 3.41 (s, 3H), 1.94-1.80 (m, 2H), 1.65 (s, 6H), 1.57-1.42 (m, 2H), 1.26 (t, J=7.2 Hz, 2H), 1.00 (t, 3H); $^{13}$C NMR (CDCl$_3$, 100 MHz) δ:192.2, 189.1, 188.8, 173.4, 171.5, 168.0, 147.9, 140.8, 131.6, 123.0, 107.5, 83.5, 74.2, 51.1, 47.2, 32.1, 30.2, 27.0, 18.7, 13.4; HRMS (m/z): [M+H]$^+$ calcd for C$_{21}$H$_{24}$NO$_5$: 370.1649; found: 370.1647.

(E)-2-((2-butoxy-3,4-dioxocyclobut-1-en-1-yl)methylene)-1-hexyl-3-decyl-3-octyl-indoline-5-carboxylic acid (11)

20 mg, Yield: 11%; $^1$H NMR (CDCl$_3$, 200 MHz) δ: 7.20 (m, 2H), 7.08 (t, J=6.6 Hz, 1H), 6.85 (d, J=8.0 Hz), 5.50 (s, 1H), 4.87 (t, J=6.4 Hz, 2H), 3.82 (t, J=7.2 Hz, 2H), 2.56-2.40 (m, 2H), 2.02-1.69 (m, 8H), 1.29-1.00 (b, 32H), 0.85 (t, J=1.4 Hz, 12H), 0.51 (m, 2H); $^{13}$C NMR (CDCl$_3$, 100 MHz) δ: 192.8, 187.4, 186.9, 173.0, 166.2, 144.5, 137.3, 127.6, 122.5, 122.0, 108.0, 81.7, 73.6, 57.1, 43.0, 39.6, 32.1, 31.8, 31.4, 29.6, 29.4, 29.3, 29.1, 26.8, 26.2, 22.5, 18.8, 14.0, 13.9, 13.7; MALDI-TOF (m/z):[M+H]$^+$ calcd for C$_{41}$H$_{66}$NO$_3$: 620.4964; found: 620.5691.

Example 5: Synthesis of Unsymmetrical SQ Compounds

Indolium iodide derivatives (5a, 6a, 6b, 7a, 7b; 1 equiv.) and semi-squaraine derivatives (8, 9, 10, 11; 1 equiv.) were dissolved in 1-butanol and dry toluene (1:1, 3 mL each) in a 50 mL two necked round bottomed flask, dry pyridine (1.5 equiv.) was added to it and charged with Dean-Stark apparatus according the FIG. 8. The reaction mixture was refluxed for 24 h under inert atmosphere. The reaction mixture was cooled to room temperature and the solvents were removed under reduced pressure. The reaction mixture was subjected to column chromatography (SiO$_2$, 100-200 mesh, 5% CH$_3$OH and 95% CH$_2$Cl$_2$) to afford the required dye as green coloured solids. In case of 18, pet.ether and EtOAc were used as eluents.

5-Carboxy-2-[[3-[(1,3-dihydro-1,3,3-trimethyl-2H-indol-2-ylidene)methyl]-2-hydroxy-4-oxo-2-cyclobuten-1-ylidene]methyl]-1,3,3-trimethyl-3H-indolium (SQ-1)

0.17 g, Yield: 87%; $^1$H NMR (CDCl$_3$, 200 MHz) δ: 8.11 (dd, J=8.1, 1.4 Hz, 1H), 8.03 (s, 1H), 7.47-7.32 (m, 3H), 7.09 (d, J=7.6 Hz, 1H), 6.98 (d, J=8.6 Hz, 1H), 6.09 (s, 1H), 5.99 (s, 1H), 3.67 (s, 3H), 3.53 (s, 3H), 1.80 (b, 12H); $^{13}$C NMR (CDCl$_3$, 100 MHz) δ: 181.4, 176.6, 172.8, 169.4, 168.8, 146.8, 145.1, 142.2, 141.6, 141.3, 130.7, 128.2, 127.6, 124.4, 123.4, 121.9, 109.6, 107.9, 87.6, 87.3, 61.5, 49.4, 47.9, 33.3, 31.1, 30.2, 26.8, 26.3; HRMS (m/z):[M+H]$^+$ calcd for C$_{29}$H$_{29}$N$_2$O$_4$: 469.2128; found: 469.2118.

5-Carboxy-2-[[3-[(1,3-dihydro-3,3-dimethyl-1-hexyl-2H-indol-2-ylidene)methyl]-2-hydroxy-4-oxo-2-cyclobuten-1-ylidene]methyl]-1,3,3-trimethyl-3H-indolium (SQ-2)

0.54 g, Yield: 79%; $^1$H NMR (CDCl$_3$, 200 MHz) δ: 8.11 (dd, J=8.3, 1.4 Hz, 1H), 8.05 (s, 1H), 7.42-7.21 (m, 3H), 7.06 (d, J=7.6 Hz, 1H), 6.98 (d, J=8.6 Hz, 1H), 6.12 (s, 1H), 5.89 (s, 1H), 4.08 (t, J=7.8 Hz, 2H), 3.52 (s, 3H), 1.82 (broad s, 12H), 1.62-1.09 (m, 8H), 0.86 (t, J=6.8 Hz, 3H); $^{13}$C NMR (CDCl$_3$, 100 MHz) δ: 182.2, 176.6, 172.6, 170.1, 168.9, 147.3, 142.6, 142.0, 141.8, 131.1, 127.9, 124.7, 124.4, 123.9, 122.4, 110.1, 108.0, 87.9, 87.7, 49.9, 48.2, 44.1, 31.4, 30.9, 30.5, 27.2, 27.2, 26.7, 26.6, 22.4, 13.9; HRMS (m/z): [M]$^+$ calcd for C$_{34}$H$_{38}$N$_2$O$_4$: 538.2832; found: 538.2831.

5-Carboxy-2-[[3-[(1,3-dihydro-1,3,3-trimethyl-2H-indol-2-ylidene)methyl]-2-hydroxy-4-oxo-2-cyclobuten-1-ylidene]methyl]-3,3-dimethyl-1-hexyl-3H-indolium (SQ-3)

0.13 g, Yield: 35%; $^1$H NMR (CDCl$_3$, 200 MHz) δ: 8.03 (dd, J=8.2, 1.6 Hz, 1H), 7.98 (s, 1H), 7.34-7.13 (m, 3H), 7.00 (d, J=8.0 Hz, 1H), 6.90 (d, J=8.6 Hz, 1H), 5.98 (s, 1H), 5.95 (s, 1H), 4.04 (broad t, 2H), 3.58 (s, 3H), 1.72 (broad s, 12H), 1.42-1.18 (m, 8H), 0.81 (t, J=6.2 Hz, 3H); $^{13}$C NMR (CDCl$_3$, 100 MHz) δ: 181.2, 177.4, 172.9, 171.0, 170.6, 168.9, 146.9, 145.5, 142.7, 142.0, 131.7, 131.1, 130.8, 127.9, 126.8, 124.6, 124.0, 123.2, 122.3, 109.8, 108.5, 87.9, 87.5, 53.9, 49.7, 48.5, 43.7, 31.5, 27.2, 26.9, 26.8, 26.7, 26.6, 22.8, 22.4, 15.5, 13.9; HRMS (m/z): [M]$^+$ calcd for C$_{34}$H$_{38}$N$_2$O$_4$: 538.2832; found:538.2829.

5-Carboxy-2-[[3-[(1,3-dihydro-3,3-dimethyl-1-hexyl-2H-indol-2-ylidene)methyl]-2-hydroxy-4-oxo-2-cyclobuten-1-ylidene]methyl]-3,3-dimethyl-1-hexyl-3H-indolium (SQ-4)

95 mg, Yield: 62%; $^1$H NMR (CDCl$_3$, 200 MHz) δ:8.12 (dd, J=8.4, 1.8 Hz, 1H), 8.06 (s, 1H), 7.45-7.20 (m, 3H), 7.05 (d, J=7.8 Hz, 1H), 6.96 (d, J=8.6 Hz, 1H), 6.11 (s, 1H), 6.02 (s, 1H), 4.22-3.86 (b, 4H), 1.85-1.78 (b, 12H), 1.52-1.17 (m, 16H), 0.87 (t, J=6.8 Hz, 6H); $^{13}$C NMR (CDCl$_3$, 100 MHz) δ: 182.0, 177.4, 172.6, 168.8, 147.3, 142.8, 142.6, 142.4, 142.3, 139.3, 131.4, 128.3, 128.2, 124.9, 124.6, 124.3, 122.7, 110.3, 108.6, 88.1, 87.8, 50.2, 50.0, 48.7, 48.2, 44.4, 44.0, 31.7, 30.0, 27.5, 27.4, 27.2, 27.1, 27.0, 22.8, 14.4, 14.2; HRMS (m/z): [M]$^+$ calcd for C$_{39}$H$_{48}$N$_2$O$_4$: 608.3614; found: 608.3608.

5-Carboxy-2-[[3-[(1,3-dihydro-1-hexyl-3-decyl-3-octyl-2H-indol-2-ylidene)methyl]-2-hydroxy-4-oxo-2-cyclobuten-1-ylidene]methyl]-1,3,3-trimethyl-3H-indolium (SQ-5)

111 mg, Yield: 45%; $^1$H NMR (CDCl$_3$, 400 MHz) δ:8.10 (dd, J=8.4, 1.6 Hz, 1H), 8.04 (d, J=1.6 Hz, 1H), 7.38-7.21 (m, 3H), 7.05 (d, J=8.4 Hz, 1H), 6.96 (d, J=8.8 Hz, 1H), 6.16 (s, 1H), 5.97 (s, 1H), 4.09 (b, 2H), 3.51 (s, 3H), 3.01 (b, 2H), 2.01 (m, 2H), 1.83 (s, 6H), 1.53-1.39 (m, 2H), 1.37-1.28 (m, 4H), 1.23-0.97 (b, 28H), 0.90-0.84 (m, 9H), 0.46 (m, 2H); $^{13}$C NMR (CDCl$_3$, 100 MHz) δ:182.6, 176.5, 171.5, 170.7, 168.6, 147.7, 144.2, 142.0, 131.4, 128.1, 124.9, 124.2, 122.7, 110.1, 108.1, 88.6, 88.3, 59.6, 48.4, 44.5, 40.2, 32.1, 32.0, 31.7, 29.8, 29.7, 29.7, 29.5, 29.3, 27.6, 27.1, 22.3, 22.8, 14.3, 14.2; HRMS (m/z): [M]$^+$ calcd for C$_{50}$H$_{70}$N$_2$O$_4$: 762.5330; found: 762.5334.

5-Carboxy-2-[[3-[(1,3-dihydro-1,3,3-trimethyl-2H-indol-2-ylidene)methyl]-2-hydroxy-4-oxo-2-cyclobuten-1-ylidene]methyl]-1-hexyl-3-decyl-3-octyl-3H-indolium (SQ-6)

121 mg, Yield: 53%; $^1$H NMR (CDCl$_3$, 200 MHz) δ: 8.11 (dd, J=8.6, 1.4 Hz, 1H), 7.97 (d, J=1.4 Hz, 1H), 7.42-7.20 (m, 3H), 7.06 (d, J=8.0 Hz, 1H), 6.96 (d, J=8.6 Hz, 1H), 6.10 (s, 1H), 6.03 (s, 1H), 3.98 (t, J=6.6 Hz, 2H), 3.63 (s, 3H), 2.99 (t, J=9.4 Hz, 2H), 2.05 (m, 2H), 1.87-1.69 (b, 6H), 1.50-1.24 (b, 6H), 1.23-1.0 (b, 28H), 0.95-0.72 (m, 9H), 0.46 (m, 2H); $^{13}$C NMR (CDCl$_3$, 125 MHz) δ: 182.6, 181.9, 178.6, 172.6, 170.9, 167.3, 149.1, 143.0, 139.1, 131.3, 128.2, 124.7, 124.4, 124.2, 124.1, 122.6, 109.9, 108.4, 89.0, 87.8, 58.2, 49.9, 44.0, 40.4, 32.1, 32.0, 31.8, 29.9, 29.8, 29.7, 29.6, 29.5, 29.3, 27.1, 22.8, 14.3, 14.2; HRMS (m/z): [M]$^+$ calcd for C$_{50}$H$_{70}$N$_2$O$_4$: 762.5330; found: 762.5334.

5-Carboxy-2-[[3-[(1,3-dihydro-1-hexyl-3-decyl-3-octyl-2H-indol-2-ylidene)methyl]-2-hydroxy-4-oxo-2-cyclobuten-1-ylidene]methyl]-1-hexyl-3-decyl-3-octyl-3H-indolium (SQ-7)

20 mg, Yield: 34%; $^1$H NMR (CDCl$_3$, 200 MHz) δ: 8.10 (d, J=8.4 Hz, 1H), 7.95 (s, 1H), 7.40-7.14 (m, 3H), 7.02 (d, J=8.2 Hz, 1H), 6.85 (d, J=8.6 Hz, 1H), 6.23-5.93 (b, 2H), 4.18-3.82 (b, 4H), 3.12-2.89 (b, 4H), 2.12-1.89 (b, 6H), 1.87-1.67 (b, 6H), 1.5-0.7 (b, 78H), 0.46 (m, 4H); $^{13}$C NMR (CDCl$_3$, 125 MHz) δ: 183.3, 179.9, 179.2, 170.9, 170.4, 166.4, 149.1, 144.0, 138.8, 131.1, 127.8, 124.4, 123.9, 123.2, 122.4, 109.6, 107.8, 89.5, 88.2, 59.2, 57.6, 43.6, 40.2, 37.1, 31.8, 31.5, 29.7, 29.5, 29.3, 29.2, 29.1, 26.9, 22.6, 14.1, 14.0; MALDI-TOF (m/z): [M]$^+$ calcd for C$_{71}$H$_{112}$N$_2$O$_4$: 1056.8622, found: 1056.6190.

Example 6: Synthesis of SQ-BDT Dye, RSQ1 and RSQ2 a) 1-Hexyl-2,3,3-trimethyl-3H-indol-1-ium iodide (ii)

A mixture of 2,3,3-trimethylindolenine (i) (2 g, 12.56 mmol) and n-hexyl iodide (3.2 g, 15.07 mmol) was stirred and heated at 100° C. for 12 h. The reaction mixture was cooled to room temperature (27°) after the completion of reaction. The contents were dissolved in minimum amount of dichloromethane and poured over 100 mL of diethyl ether and filtered under vacuum. The precipitate obtained was washed with diethyl ether (20 mL×3) to give pure compound ii (4.3 g, 92%) as brown solid. Mp 135-137° C. $^1$H NMR (200 MHz, CDCl$_3$) δ 7.71-7.49 (m, 4H), 4.76-4.54 (m, 2H), 3.10 (s, 3H), 2.04-1.82 (m, 2H), 1.64 (s, 6H), 1.51-1.18 (m, 6H), 0.86 (t, J=6.9 Hz, 3H). $^{13}$C NMR (101 MHz, MeOH-d$_4$) δ 197.6, 143.4, 142.5, 131.2, 130.5, 124.7, 116.6, 55.9, 49.5, 32.4, 28.8, 27.4, 23.5, 22.8, 14.3. HRMS (ESI) m/z: [M]$^+$ Calcd for C$_{17}$H$_{26}$N$^+$ 244.2060: Found 244.2053.

b) 3-Butoxy-4-((1-hexyl-3,3-dimethylindolin-2-ylidene)methyl)cyclobut-3-ene-1,2-dione (iii)

To solution of compound ii (3.5 g, 9.43 mmol) in 25 mL of n-butanol, 3,4-dibutoxycyclobut-3-ene-1,2-dione (2.13 g, 9.43 mmol) was added. To the stirring mixture triethylamine (1.34 g, 13.2 mmol) was added dropwise. The resultant mixture was stirred at room temperature (27°) for 12 h followed by heating at 70° C. for 1 h. Solvents were evaporated after the completion of reaction and crude product was purified by column chromatography by silica gel to give compound iii (2.9 g, 77%) as yellow solid. Mp 85-87° C. $^1$H NMR (400 MHz, CDCl$_3$) δ 7.31-7.24 (m, 2H), 7.12-7.00 (m, 1H), 6.88 (dd, J=7.1, 1.4 Hz, 1H), 5.41 (s, 1H), 4.86 (t, J=6.6 Hz, 2H), 3.87-3.75 (m, 2H), 1.93-1.80 (m, 2H), 1.74 (d, J=7.4 Hz, 2H), 1.63 (d, J=4.5 Hz, 6H), 1.52 (dd, J=15.0, 7.5 Hz, 2H), 1.46-1.38 (m, 2H), 1.35 (ddd, J=7.3, 4.5, 2.5 Hz, 4H), 1.01 (t, J=7.4 Hz, 3H), 0.90 (t, J=7.1 Hz, 3H). $^{13}$C NMR (101 MHz, CDCl$_3$) δ 192.8, 187.7, 187.6, 173.7, 168.5, 142.8, 141.0, 127.8, 122.8, 122.1, 108.5, 81.4, 73.9, 48.1, 43.1, 32.3, 31.5, 27.1, 26.8, 26.4, 22.60, 18.9, 14.1, 13.8. HRMS (ESI) m/z: [M+H]$^+$ Calcd for C$_{25}$H$_{34}$NO$_3$ 396.2539; Found 396.2530.

c) 3-((1-Hexyl-3,3-dimethylindolin-2-ylidene) methyl)-4-hydroxycyclobut-3-ene-1,2-dione (iv)

To a solution of compound iii (2.45 g, 6.194 mmol) in 15 mL of acetone, 5 mL of 2N HCl was added. Resultant mixture was refluxed for 8 h, and solvents were removed under reduced pressure after the completion of reaction. The crude compound iv (1.98 g, 94%), obtained as dark yellow solid, was used further without purification. Mp 170-172° C. $^1$H NMR (400 MHz, CDCl$_3$) δ 10.01 (s, 1H), 7.31 (dd, J=10.2, 7.9 Hz, 2H), 7.13 (t, J=7.4 Hz, 1H), 6.96 (d, J=7.8 Hz, 1H), 5.68 (s, 1H), 3.91 (t, J=6.6 Hz, 2H), 1.82-1.74 (m, 2H), 1.67 (s, 6H), 1.43 (d, J=6.1 Hz, 2H), 1.39-1.31 (m, 4H), 0.90 (t, J=6.8 Hz, 3H). $^{13}$C NMR (101 MHz, CDCl$_3$) δ 189.9, 187.6, 176.9, 170.7, 142.5, 141.4, 128.0, 123.6, 122.2, 109.2, 82.4, 48.7, 43.5, 31.5, 29.8, 27.0, 26.7, 26.6, 22.6, 14.0. HRMS (ESI) m/z: [M+H]$^+$ Calcd for C$_{21}$H$_{25}$NO$_3$ 340.1913; Found 340.1903.

d) 5-Bromo-1-hexyl-2,3,3-trimethyl-3H-indol-1-ium iodide (vi)

A mixture of 5-bromo-2,3,3-trimethyl-3H-indole v (1.7 g, 7.14 mmol) and n-hexyliodide (1.82 g, 8.56 mmol) was heated at 100° C. for 4 h. Reaction mixture was cooled to room temperature after (27° C.) the completion of the reaction. The contents were dissolved in minimum amount of dichloromethane and precipitated by pouring in 100 mL of diethyl ether. The precipitate obtained was washed with diethyl ether (20 mL×3) and dried under vacuum to give compound vi (1.7 g, 53%) as dark brown solid. Mp 208-210° C. $^1$H NMR (200 MHz, DMSO-d$_6$) δ 8.20 (s, 1H), 7.96 (d, J=8.5 Hz, 1H), 7.85 (d, J=8.7 Hz, 1H), 4.43 (t, J=7.4 Hz, 2H), 2.84 (s, 3H), 1.80 (s, 2H), 1.55 (s, 6H), 1.30 (s, 6H), 0.86 (s, 3H). $^{13}$C NMR (101 MHz, CDCl$_3$) δ 198.1, 145.5, 141.7, 133.7, 128.3, 128.2, 125.3, 118.3, 56.1, 49.8, 32.4, 28.8, 27.4, 23.5, 22.7, 14.3. HRMS (ESI) m/z: [M]$^+$ Calcd for C$_{17}$H$_{25}$BrN$^+$ 322.1165; Found 322.1160.

e) 4-((5-Bromo-1-hexyl-3,3-dimethyl-3H-indol-1-ium-2-yl)methylene)-2-((1-hexyl-3,3-dimethylindolin-2-ylidene)methyl)-3-oxocyclobut-1-en-1-olate (viii)

A mixture of compound 6 (0.3 g, 0.88 mmol) and compound iv (0.478 g, 1.06 mmol) in 16 mL of toluene/n- butanol (1:1) was refluxed under dean-stark apparatus for 24 h. After the completion of reaction the solvent were removed under reduced pressure and crude product was purified by column chromatography by silica gel using ethyl acetate/dichloromethane as eluent to yield compound vii (0.32 g, 56%) as blue solid. Mp 172-173° C. $^1$H NMR (400 MHz, CDCl$_3$) δ 7.46-7.28 (m, 4H), 7.17 (t, J=7.4 Hz, 1H), 7.01 (d, J=7.9 Hz, 1H), 6.82 (dd, J=13.3, 8.4 Hz, 1H), 6.06-5.83 (m, 2H), 4.01 (d, J=7.1 Hz, 2H), 3.91 (s, 2H), 1.81 (s, 2H), 1.78 (d, J=5.6 Hz, 12H), 1.72 (s, 2H), 1.45-1.28 (m, 12H), 0.89 (t, J=6.5 Hz, 6H). $^{13}$C NMR (101 MHz, CDCl$_3$) δ 181.1, 171.2, 168.6, 142.5, 130.8, 130.7, 128.0, 125.9, 125.8, 124.2, 122.5, 116.7, 116.2, 110.5, 109.8, 87.1, 86.9, 49.7, 49.2, 44.0, 31.6, 31.6, 29.8, 27.3, 27.2, 27.1, 27.0, 26.9, 26.8, 22.66, 22.65, 22.6, 14.1. HRMS (ESI) m/z: [M+H]$^+$ Calcd for C$_{38}$H$_{48}$BrN$_2$O$_2$ 643.2899; Found 643.2885.

f) 4,8-Dimethoxybenzo[1,2-b:4,5-b']dithiophene-2-carbaldehyde (ixa)

In a two necked round bottom flask fitted with reflux condenser, viiia (1.2 g, 5.20 mmol) was taken. It was dissolved in 20 mL of 1,2-dichloroethane and N,N-dimethylformamide (8 mL, 104 mmol) was added to the mixture. The flask was cooled to 0° C. and POCl$_3$ (9.5 mL, 104 mmol) was added to it dropwise and refluxed for 24 h. After completion of reaction the reaction mixture was poured in ice cold solution of ammonium chloride and extracted by dichloromethane. The organic layer was dried over sodium sulphate and solvents were removed under reduced pressure. The crude product was purified by column chromatography over silica gel with ethyl acetate/pet ether as eluent to afford ixa (1.2 g, 80%) as light yellow solid. Mp 140-143° C. $^1$H NMR (200 MHz, CDCl$_3$) δ 10.10 (s, 1H), 8.23 (s, 1H), 7.52 (s, 2H), 4.22 (s, 3H), 4.13 (s, 3H). $^{13}$C NMR (101 MHz, CDCl$_3$) δ 184.6, 148.0, 145.4, 143.0, 135.1, 131.6, 131.3, 130.1, 129.6, 128.9, 120.4, 61.5, 61.2. HRMS (ESI) m/z: [M+H]$^+$ Calcd for C$_{13}$H$_{11}$O$_3$S$_2$ 279.0150; Found 279.0140.

g) 4,8-Bis((2-ethylhexyl)oxy)benzo[1,2-b:4,5-b']dithiophene-2-carbaldehyde (ixb)

In a two necked round bottom flask fitted with reflux condenser, viiib (2.8 g, 6.27 mmol) was taken. It was dissolved in 20 mL of 1,2-dichloroethane and N,N-dimethylformamide (9.76 mL, 125.4 mmol) was added to the mixture. The flask was cooled to 0° C. and POCl$_3$ (11.7 mL, 125.361 mmol) was added to it dropwise and refluxed for 48 h. After completion of reaction the reaction mixture was poured in ice cold solution of ammonium chloride and extracted by dichloromethane. The organic layer was dried over sodium sulphate and solvents were removed under reduced pressure. The crude product was purified by column chromatography over silica gel with ethyl acetate/pet ether as eluent to afford ixb ((2 g, 67%) as yellow viscous oil. $^1$H NMR (400 MHz, CDCl$_3$) δ 10.10 (s, 1H), 8.17 (s, 1H), 7.49 (s, 2H), 4.27 (d, J=5.4 Hz, 2H), 4.18-4.15 (m, 2H), 1.82 (dd, J=12.0, 6.0 Hz, 2H), 1.75-1.65 (m, 2H), 1.62-1.56 (m, 4H), 1.54-1.47 (m, 2H), 1.41-1.35 (m, 8H), 1.05-0.99 (m, 6H), 0.97-0.90 (m, 6H). $^{13}$C NMR (101 MHz, CDCl$_3$) δ 184.7, 147.4, 144.7, 142.7, 135.3, 131.9, 131.5, 130.3, 129.9, 128.6, 120.6, 76.7, 76.4, 40.8, 30.5, 29.3, 24.0, 23.2, 14.3, 11.4.

HRMS (ESI) m/z: [M+H]$^+$ Calcd for C$_{27}$H$_{39}$P$_3$S$_2$ 475.2341; Found 475.2333.

h) General Synthetic Procedure for Direct Arylation of Squaraine and BDT

In a Schlenk tube corresponding bromo-squaraine (vii) and BDT aldehydes (ixa and ixb) were taken. The Shclenk tube is evacuated and refilled with nitrogen three times. Pd(OAc)$_2$ (5 mol %), PCy$_3$ (10 mol %), PivOH (30 mol %) and K$_2$CO$_3$ (2.5 eq.) were added to it followed by 4 mL of anhydrous toluene. The mixture was stirred at 110° C. for 24 h. After completion of the reaction, the mixture was poured into water and extracted with dichloromethane. The organic layer was then washed with brine, dried over sodium sulfate and concentrated under vacuum. Crude product was purified by column chromatography to give of pure compounds.

i) (Z)-4-((5-(6-Formyl-4,8-dimethoxybenzo[1,2-b:4,5-b']dithiophen-2-yl)-1-hexyl-3,3-dimethyl-3H-indol-1-ium-2-yl)methylene)-2-(((Z)-1-hexyl-3,3-dimethylindolin-2-ylidene)methyl)-3-oxocyclobut-1-en-1-olate (xa)

From bromo-squaraine 7 (0.250 g, 0.388 mmol) and aldehyde ixa (0.432 g, 1.55 mmol), the compound xa (0.2 g, 61%) was obtained as green solid. Mp 251-253° C. $^1$H NMR (500 MHz, CDCl$_3$) δ 10.10 (s, 1H), 8.22 (s, 1H), 7.71 (d, J=1.7 Hz, 1H), 7.69 (s, 1H), 7.69 (s, 1H), 7.39 (d, J=7.3 Hz, 1H), 7.33 (td, J=7.8, 0.9 Hz, 1H), 7.18 (t, J=7.3 Hz, 1H), 7.02 (dd, J=10.3, 8.5 Hz, 2H), 6.03 (s, 1H), 6.00 (s, 1H), 4.26 (s, 3H), 4.18 (s, 3H), 4.06-4.01 (m, 2H), 4.00-3.94 (m, 2H), 1.88 (s, 6H), 1.81 (s, 6H), 1.50-1.40 (m, 6H), 1.37-1.31 (m, 10H), 0.92-0.88 (m, 6H). $^{13}$C NMR (126 MHz, CDCl$_3$) δ 184.5, 181.3, 178.4, 171.4, 168.5, 147.6, 146.5, 145.0, 142.6, 142.4, 136.4, 131.8, 131.6, 130.2, 129.0, 128.5, 128.0, 126.9, 124.3, 122.5, 120.6, 114.8, 109.9, 109.5, 87.2, 61.4, 61.2, 49.8, 49.1, 44.1, 43.9, 31.63, 31.61, 29.8, 27.5, 27.33, 27.25, 27.13, 27.05, 26.9, 22.7, 14.1. HRMS (ESI) m/z: [M+H]$^+$ Calcd for C$_{51}$H$_{57}$N$_2$O$_5$S$_2$ 841.3709; Found 841.3701.

j) (Z)-4-((5-(4,8-Bis((2-ethylhexyl)oxy)-6-formyl-benzo[1,2-b:4,5-b']dithiophen-2-yl)-1-hexyl-3,3-dimethyl-3H-indol-1-ium-2-yl)methylene)-2-(((Z)-1-hexyl-3,3-dimethylindolin-2-ylidene)methyl)-3-oxocyclobut-1-en-1-olate (xb)

From bromo-squaraine 7 (0.200 g, 0.310 mmol) and aldehyde ixb (0.589 g, 1.24 mmol), 0.150 g of compound xb (0.15 g, 46%) was obtained as green sticky gum. $^1$H NMR (400 MHz, CDCl$_3$) δ 10.10 (s, 1H), 8.17 (s, 1H), 7.69 (d, J=8.3 Hz, 1H), 7.66 (s, 1H), 7.63 (s, 1H), 7.39 (d, J=7.3 Hz, 1H), 7.33 (t, J=7.6 Hz, 1H), 7.18 (t, J=7.4 Hz, 1H), 7.02 (dd, J=7.5, 5.4 Hz, 2H), 6.03 (s, 1H), 6.00 (s, 1H), 4.32 (d, J=5.4 Hz, 2H), 4.21 (d, J=5.2 Hz, 2H), 4.06-3.95 (m, 4H), 1.87 (s, 6H), 1.81 (s, 6H), 1.73-1.53 (m, 10H), 1.47-1.39 (m, 14H), 1.36-1.25 (m, 10H), 1.05 (t, J=7.3 Hz, 6H), 0.97-0.89 (m, 12H). $^{13}$C NMR (101 MHz, CDCl$_3$) δ 184.6, 181.3, 178.5, 171.3, 168.5, 147.1, 146.1, 144.4, 142.4, 136.6, 132.0, 131.9, 130.3, 129.2, 128.7, 128.0, 126.8, 124.329, 122.5, 120.6, 115.0, 109.9, 87.2, 76.6, 76.3, 49.8, 49.1, 44.1, 40.8, 40.8, 31.6, 30.6, 30.5, 29.3, 27.4, 27.3, 27.13, 27.07, 26.9, 24.0, 23.3, 22.7, 14.3, 14.1, 11.5. HRMS (ESI) m/z: [M+H]$^+$ Calcd for C$_{65}$H$_{85}$N$_2$O$_5$S$_2$ 1037.5900; Found 1037.5876.

k) General Procedure for Knoevenagel Condenstation of Aldehyde to Cyanoacetic Acid Corresponding aldehydes (xa and xb) were dissolved in 5 mL of chloroform and 5 mL of acetonitrile. To this 5 eq.

cyanoacetic acid was added followed by 40 μL of piperidine. The resultant solution was stirred at 80° C. for 12 h. Solvents were removed under rotavap after completion of reaction and dissolved in 50 mL of dichloromethane. The organic layer was washed with water followed by brine and dried over sodium sulphate. The solvents were removed under reduced pressure and purified by column chromatography by silica gel using MeOH/CHCl$_3$ as an eluent.

l) 4-((5-(6-(-2-Carboxy-2-cyanovinyl)-4,8-dimethoxybenzo[1,2-b:4,5-b']dithiophen-2-yl)-1-hexyl-3,3-dimethyl-3H-indol-1-ium-2-yl)methylene)-2-((-1-hexyl-3,3-dimethylindolin-2-ylidene)methyl)-3-oxocyclobut-1-en-1-olate (RSQ-1)

From xa (0.15 g, 0.178 mmol), pure compound RSQ-1 (0.1 g, 62%) was obtained as dark green solid. Mp 281-283° C. $^1$H NMR (400 MHz, DMSO-d$_6$+CDCl$_3$) δ 8.30 (s, 1H), 7.95 (s, 1H), 7.67 (d, J=9.7 Hz, 2H), 7.62 (d, J=8.1 Hz, 1H), 7.33 (d, J=7.3 Hz, 1H), 7.27 (t, J=7.6 Hz, 1H), 7.11 (t, J=7.4 Hz, 1H), 7.05 (t, J=8.4 Hz, 2H), 5.88 (s, 1H), 5.84 (s, 1H), 4.12 (s, 3H), 4.07 (s, 3H), 4.04-3.89 (m, 4H), 1.75 (s, 6H), 1.69 (s, 6H), 1.40-1.16 (m, 16H), 0.81 (t, J=6.5 Hz, 6H). $^{13}$C NMR (101 MHz, DMSO-d$_6$+CDCl$_3$) δ 181.3, 180.1, 170.2, 167.7, 145.6, 145.1, 143.8, 143.1, 142.8, 142.3, 141.7, 141.5, 135.7, 134.4, 130.7, 129.2, 128.9, 128.4, 127.9, 127.5, 126.3, 123.8, 121.8, 119.7, 117.6, 114.3, 109.6, 109.4, 86.3, 63.0, 60.7, 60.6, 48.9, 48.3, 43.1, 30.9, 29.0, 26.7, 26.5, 26.3, 26.0, 21.9, 13.5. HRMS (ESI) m/z: [M]$^+$ Calcd for C$_{54}$H$_{57}$N$_3$O$_6$S$_2$ 907.3689; Found 907.3683.

m) 4-((5-(6-(-2-carboxy-2-cyanovinyl)-4,8-bis((2-ethylhexyl)oxy)benzo[1,2-b:4,5-b']dithiophen-2-yl)-1-hexyl-3,3-dimethyl-3H-indol-1-ium-2-yl)methylene)-2-((-1-hexyl-3,3-dimethylindolin-2-ylidene)methyl)-3-oxocyclobut-1-en-1-olate (RSQ-2)

From xb (0.1 g, 0.097 mmol), compound RSQ-2 (0.065, 61%) was obtained as dark green solid. Mp 242-243° C. $^1$H NMR (400 MHz, DMSO-d$_6$+CDCl$_3$) δ 8.38 (s, 1H), 8.08 (s, 1H), 7.63 (d, J=7.0 Hz, 2H), 7.58 (s, 1H), 7.35 (d, J=7.3 Hz, 1H), 7.28 (t, J=7.6 Hz, 1H), 7.11 (dd, J=14.5, 7.6 Hz, 3H), 5.88 (s, 1H), 5.84 (s, 1H), 4.21 (d, J=4.9 Hz, 2H), 4.13 (d, J=4.2 Hz, 3H), 4.05-3.93 (m, 4H), 1.77 (s, 6H), 1.70 (s, 6H), 1.65-1.43 (m, 10H), 1.42-1.32 (m, 14H), 1.30-1.16 (m, 10H), 0.98 (dd, J=16.7, 7.6 Hz, 6H), 0.91-0.87 (m, 6H), 0.83 (t, J=6.2 Hz, 6H). $^{13}$C NMR (101 MHz, CDCl$_3$) δ 181.1, 180.2, 177.4, 170.2, 167.5, 145.4, 145.3, 143.0, 142.9, 142.1, 141.7, 141.4, 135.1, 134.8, 131.3, 128.9, 128.3, 128.1, 127.5, 126.3, 123.7, 121.7, 119.5, 116.0, 115.9, 114.3, 109.7, 109.6, 86.5, 86.3, 78.2, 75.9, 75.4, 49.5, 48.9, 48.2, 43.2, 30.8, 29.9, 29.7, 28.6, 28.5, 26.6, 26.5, 26.3, 26.0, 23.2, 22.49, 22.46, 21.9, 13.7, 13.5, 10.9. HRMS (ESI) m/z: [M+H]$^+$ Calcd for C$_{68}$H$_{86}$N$_3$O$_6$S$_2$ 1104.5958; Found 1104.5946.

Example 7: Solar Cells Fabrication and Characterization

FTO (F-doped SnO$_2$ glass; 6-8 Ω/sq; Pilkington TEC 7) was cleaned by diluted mucasol solution in water, deionized water, and ethanol, successively. To grow a TiO$_2$ blocking layer, the substrate was immersed in freshly prepared 50 mM aqueous TiCl$_4$ solution at 70° C. for 30 min, and washed with deionized water before drying at 125° C. for 10 min. A paste of TiO$_2$ nanocrystal (<20 nm, Ti-Nanoxide T/SP, Solaronix) was deposited by the doctor-blade technique on TiO$_2$ buffer layer coated FTO substrate for transparent layer of TiO2, kept in air for 5 min and then annealed at 125° C. in air for 15 min. The films were about 6-8 μm thick. The annealed films were coated with scattering layer TiO$_2$ paste (WER2-O, Dyesol) and annealed at 125° C. in air for 15 min. The annealed films were sintered at 325° C. for 5 min, 375° C. for 5 min, 450° C. for 15 min and 500° C. for 15 min with heating rate of 5° C. per min in air. After reaching the furnace temperature at 50° C., sintered films were immersed in freshly prepared 50 mM aqueous TiCl$_4$ solution at 70° C. for 30 min. After sintering the TiCl$_4$-treated TiO$_2$ films at 500° C. for 30 min, they were immediately immersed in 0.1 mM RSQ dye solution in dichloromethane for 5 h, washed and dried at 80° C. In case of CDCA added experiments, different ratio of CDCA added to 0.1 mM dye solution and photoanode dipped for 5 h. Sandwich type cell configuration was completed using platinum as cathode, 0.5 M DMII, 0.1 M LiI, 0.1 M 12 and 10 mM TBP in CH$_3$CN was used as electrolyte and 25 m spacer. I-V characteristics of the cells were measured using Keithley digital source meter (2420, Keithley, USA) controlled by a computer and standard AM 1.5 solar simulator (PET, CT200AAA, USA). To measure the photocurrent and voltage, an external bias of AM 1.5G light was applied using a xenon lamp (450 W, USHIO INC, Philippines) and recorded. The action spectra of monochromatic incident photon-to-current conversion efficiency (IPCE) for the solar cell were performed by using a commercial setup. Electrochemical impedance spectra (EIS) were obtained by the Biologic potentiostat, equipped with an FRA2 module, with applied potential of −0.45 V in the dark. The frequency range explored was 1 Hz to 1 MHz with an ac perturbation of 10 mV. The impedance spectra were analyzed using an equivalent circuit model of R1+R2/C2+R3/C3. The loading amount of the dyes was assessed by UV-vis spectrophotometry as follows: Photoanodes were sensitized in same dye solutions which were used for photovoltaic characterization. The photoanodes were taken out and dyes were desorbed by dipping in 2 M solution of HCl in EtOH. The resultant dye solution was used to evaluate the dye concentration by UV-vis study, which allows the determination of the amount of dye adsorbed in terms of number of moles per unit area of TiO2 film.

Light Harvesting Efficiency was Obtained by $$LHE = 1-10^{-\varepsilon\Gamma} = 1-10^{-A} \quad (1)$$

Where ε is the molar extinction coefficient of the dye sensitized on TiO$_2$ film, Γ is the dye molar concentration per projected surface area of the film, and A is the absorbance of the dye-sensitized film (equal to the product of ε and Γ).

Advantages of Invention

There were very few families of dyes, porphyrins, phthalocyanines and polymethine dyes (sqauraines) absorb in the NIR regions of the solar spectrum. In the present investigation, self assembling nature of SQ dyes were systematically studied and showed the importance of branching units in SQ dyes for the high efficient device cell.

The invention claimed is:
1. A squaraine dye of formula (I):

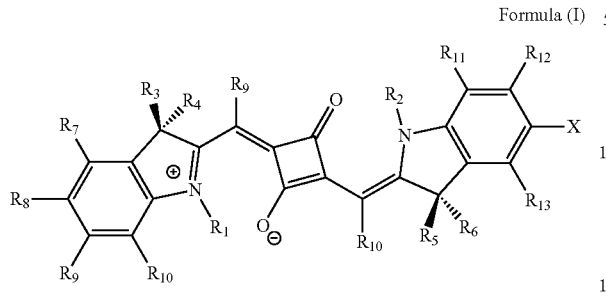

Formula (I)

wherein,
R$_1$ is selected from the group consisting of methyl, straight or branched chain —C$_5$ to C$_{20}$ alkyl, —C$_1$ to C$_{20}$ alkoxy, aryl, arylalkyl, fused aryl polyethylene glycol units, triethyleneglycol monomethylether, tetraethylene glycol monomethylether, halides, cyano, and trifluoromethyl;

R$_2$ is selected from the group consisting of straight or branched chain —C$_1$ to C$_{20}$ alkyl, —C$_1$ to C$_{20}$ alkoxy, aryl, arylalkyl, fused aryl polyethylene glycol units, triethyleneglycol monomethylether, tetraethylene glycol monomethylether, halides, cyano, and trifluoromethyl;

R$_3$-R$_{13}$ are same or different and are selected from the group consisting of hydrogen, straight or branched chain —C$_2$ to C$_{20}$ alkyl, —C$_1$ to C$_{20}$ alkoxy, aryl, arylalkyl, fused aryl polyethylene glycol units, triethyleneglycol monomethylether, tetraethylene glycol monomethylether, C$_1$ to C$_{10}$ perfluoroalkyl chains, cyano, and trifluoromethyl; or each of R$_3$-R$_6$ independently is methyl;

X is selected from the group consisting of —COOH and

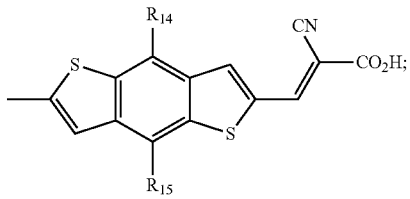

and
R$_{14}$ and R$_{15}$ are same or different and are selected from the group consisting of straight or branched chain —C$_1$ to C$_{20}$ alkyl, and —C$_1$ to C$_{20}$ alkoxy;
provided that at least one of R$_1$-R$_6$ is straight or branched chain —C$_2$ to C$_{20}$ alkyl; and
provided when R$_2$ is C$_6$ alkyl, R$_1$ is methyl or C$_6$ alkyl.

2. A squaraine dye, wherein said squaraine dye is
5-Carboxy-2-[[3-[(1,3-dihydro-3,3-dimethyl-1-hexyl-2H-indol-2-ylidene)methyl]-2-hydroxy-4-oxo-2-cyclobuten-1-ylidene]methyl]-1,3,3-trimethyl-3H-indolium (SQ2),
5-Carboxy-2-[[3-[(1,3-dihydro-1,3,3-trimethyl-2H-indol-2-ylidene)methyl]-2-hydroxy-4-oxo-2-cyclobuten-1-ylidene]methyl]-3,3-dimethyl-1-hexyl-3H-indolium (SQ3),
5-Carboxy-2-[[3-[(1,3-dihydro-3,3-dimethyl-1-hexyl-2H-indol-2-ylidene)methyl]-2-hydroxy-4-oxo-2-cyclobuten-1-ylidene]methyl]-3,3-dimethyl-1-hexyl-3H-indolium (SQ4),
5-Carboxy-2-[[3-[(1,3-dihydro-1-hexyl-3-decyl-3-octyl-2H-indol-2-ylidene)methyl]-2-hydroxy-4-oxo-2-cyclobuten-1-ylidene]methyl]-1,3,3-trimethyl-3H-indolium (SQ5),
5-Carboxy-2-[[3-[(1,3-dihydro-1,3,3-trimethyl-2H-indol-2-ylidene)methyl]-2-hydroxy-4-oxo-2-cyclobuten-1-ylidene]methyl]-1-hexyl-3-decyl-3-octyl-3H-indolium (SQ6),
5-Carboxy-2-[[3-[(1,3-dihydro-1-hexyl-3-decyl-3-octyl-2H-indol-2-ylidene)methyl]-2-hydroxy-4-oxo-2-cyclobuten-1-ylidene]methyl]-1-hexyl-3-decyl-3-octyl-3H-indolium (SQ7),
4-((5-(6-(2-Carboxy-2-cyanovinyl)-4,8-dimethoxybenzo[1,2-b:4,5-b']dithiophen-2-yl)-1-hexyl-3,3-dimethyl-3H-indol-1-ium-2-yl)methylene)-2-((1-hexyl-3,3-dimethylindolin-2-ylidene)methyl)-3-oxocyclobut-1-en-1-olate (RSQ1), or
4-((5-(6-(2-carboxy-2-cyanovinyl)-4,8-bis((2-ethylhexyl)oxy)benzo[1,2-b:4,5-b']dithiophen-2-yl)-1-hexyl-3,3-dimethyl-3H-indol-1-ium-2-yl)methylene)-2-((1-hexyl-3,3-dimethylindolin-2-ylidene)methyl)-3-oxocyclobut-1-en-1-olate 20d (RSQ2).

3. A process for the preparation of squaraine dye of formula (I) as claimed in claim 1, said process comprising the steps of:
(a) refluxing a reaction mixture of a hydrazine compound and 3-alkyl-2-alkanone dissolved in acetic acid at a temperature in the range of 80 to 100° C. for the period in the range of 14 to 16 hours to obtain a corresponding 2-methyl-3,3-dialkyl-3H-indole compound;
(b) refluxing a reaction mixture of an alkyl halide and the compound as obtained in step (a) dissolved in acetonitrile at a temperature in the range of 100 to 110° C. for the period in the range of 14 to 16 hours to obtain a corresponding indolenium salt;
(c) heating a reaction mixture of the compound obtained in step (b) and 3, 4-dibutoxycyclobut-3-ene-1,2-dione dissolved in a solvent in the presence of triethylamine at a temperature in the range of 60 to 70° C. for the period in the range of 1 to 2 hours to obtain a semi-squaraine compound;
(d) refluxing a reaction mixture of the compound obtained in step (c) with the compound obtained in step (b) dissolved in a solvent in the presence of pyridine at a temperature in the range of 110 to 115° C. for the period in the range of 20 to 24 hours to obtain a corresponding dye of formula (I); wherein X is —COOH;
(e) stirring a reaction mixture of the squaraine dye of formula (I) obtained in step (d), a benzodithiophene compound, palladium (II) acetate [Pd(OAc)$_2$], tricyclohexylphosphine (PCy$_3$), and pivalic acid (PivOH) in the presence of potassium carbonate (K$_2$CO$_3$) in toluene at a temperature of 110° C. for the period in the range of 14 to 16 hours to obtain an aldehyde compound;
(f) adding cyanoacetic acid and piperidine to a reaction mixture of containing the compound as obtained in step (e) in a solvent followed by stirring the reaction mixture at a temperature in the range of 70 to 80° C. for the period in the range of 14 to 16 hours to obtain a dye of formula (I) wherein X is not —COOH.

4. The process as claimed in claim 3, wherein said hydrazine compound is 4-hydrazinobenzoic acid or phenyl hydrazine hydrochloride, said 3-alkyl-2-alkanone is 3-octyltridecan-2-one or 3-methylbut-2-one, and said alkyl halide is 1-iodohexane or iodomethane.

5. The process as claimed in claim 3, wherein said indolenium salt is 1-alkyl-2-methyl-3,3-dialkyl-3H-indol-1-ium iodide or 5-carboxy-1-alkyl-2-methyl-3,3-dialkyl-3H-indol-1-ium iodide.

6. The process as claimed in claim 3, wherein said semisquaraine compound is
(E)-2-((2-butoxy-3,4-dioxocyclobut-1-en-1-yl)methylene)-1,3,3-trimethyl-indoline (8),
(E)-2-((2-butoxy-3,4-dioxocyclobut-1-en-1-yl)methylene)-1-hexyl-3,3-dimethyl-indoline (9),
(E)-2-((2-butoxy-3,4-dioxocyclobut-1-en-1-yl)methylene)-1,3,3-trimethyl-indoline-5-carboxylic acid (10), or
(E)-2-((2-butoxy-3,4-dioxocyclobut-1-en-1-yl)methylene)-1-hexyl-3-decyl-3-octyl-indoline-5-carboxylic acid (11).

7. The process as claimed in claim 3, wherein said 2-methyl-3,3-dialkyl-3H-indole compound is 2-methyl-3,3-dialkyl-3H-indole or 2-methyl-3,3-dialkyl-3H-indole-5-carboxylic acid.

8. The process as claimed in claim 3, wherein said solvent in step (c), (d) and (f) is 1-butanol, toluene, chloroform, acetonitrile, or a mixture thereof and said process is carried out under nitrogen atmosphere.

9. An electronic device comprising a squaraine dye of formula (I) as claimed in claim 1.

10. A solar cell device comprising squaraine dye of formula (I) as claimed in claim 1, optionally along with at least one other dye, wherein said solar cell device is a dye-sensitized solar cell, wherein the dye is present in a solution form or in a film form and is chemisorbed to a photoactive semiconductor porous material, and the solar cell device has a solar cell efficiency in the range of 2.5 to 9.5%.

11. The process as claimed in claim 5, wherein the indolenium salt is
1,2,3,3-tetramethyl-3H-indolium iodide (5a);
1-hexyl-2,3,3-tetramethyl-3H-indolium iodide (5b);
5-Carboxy-1,2,3,3-tetramethyl-3H-indolium iodide (6a);
5-Carboxy-1-hexyl-2,3,3-trimethyl-3H-indolium iodide (6b);
1-hexyl-2-methyl-3-decyl-3-octyl-3H-indolium iodide (7a); or
5-carboxy-1-hexyl-2-methyl-3-decyl-3-octyl-3H-indolium iodide (7b).

12. The process as claimed in claim 7, wherein said 2-methyl-3,3-dialkyl-3H-indole compound is
2,3,3-trimethyl-3H-indole (3a),
2,3,3-trimethyl-3H-indole-5-carboxylic acid (4a),
2-methyl-3-decyl-3-octyl-3H-indole (3b), or
2-methyl-3-decyl-3-octyl-3H-indole-5-carboxylic acid (4b).

13. The squaraine dye of claim 1, wherein X is COOH.

14. The squaraine dye of claim 13, wherein $R_1$ is methyl or hexyl and $R_2$ is methyl or hexyl.

15. The squaraine dye of claim 14, wherein each of $R_3$, $R_4$, $R_5$, and $R_6$, independently, is methyl, octyl, or decyl.

16. The squaraine dye of claim 15, wherein each of $R_7$, $R_8$, $R_9$, $R_{10}$, $R_{11}$, $R_{12}$, and $R_{13}$ is H.

17. The squaraine dye of claim 1, wherein X is

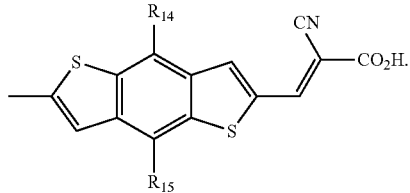

18. The squaraine dye of claim 17, wherein $R_1$ is methyl or hexyl and $R_2$ is methyl or hexyl.

19. The squaraine dye of claim 18, wherein each of $R_3$, $R_4$, $R_5$, and $R_6$, independently, is methyl, octyl, or decyl.

20. The squaraine dye of claim 19, wherein each of $R_7$, $R_8$, $R_9$, $R_{10}$, $R_{11}$, $R_{12}$, and $R_{13}$ is H.

* * * * *